United States Patent
Kawasaki et al.

(10) Patent No.: US 7,122,409 B2
(45) Date of Patent: Oct. 17, 2006

(54) SEMICONDUCTOR DEVICE AND A METHOD OF MANUFACTURING THE SAME

(75) Inventors: Ritsuko Kawasaki, Atsugi (JP); Kenji Kasahara, Atsugi (JP); Hisashi Ohtani, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 119 days.

(21) Appl. No.: 10/653,883

(22) Filed: Sep. 4, 2003

(65) Prior Publication Data

US 2004/0248387 A1    Dec. 9, 2004

Related U.S. Application Data

(62) Division of application No. 09/732,724, filed on Dec. 11, 2000, now Pat. No. 6,653,657.

(30) Foreign Application Priority Data

Dec. 10, 1999 (JP) .................... 11-35106

(51) Int. Cl.
*H01L 21/84* (2006.01)
(52) U.S. Cl. .............. 438/149; 438/151; 438/164; 438/799
(58) Field of Classification Search ............ 438/164, 438/486, 487, 795, 799, 149–151; 257/64
See application file for complete search history.

(56) References Cited

U.S. PATENT DOCUMENTS

| | | | |
|---|---|---|---|
| 4,422,090 A | 12/1983 | Shepherd et al. | |
| 5,056,099 A | 10/1991 | Bradley | |
| 5,508,533 A * | 4/1996 | Takemura | 257/64 |
| 5,580,792 A * | 12/1996 | Zhang et al. | 438/166 |
| 5,580,801 A * | 12/1996 | Maegawa et al. | 438/164 |
| 5,583,366 A | 12/1996 | Nakazawa | |
| 5,594,569 A | 1/1997 | Konuma et al. | |
| 5,643,826 A | 7/1997 | Ohtani et al. | |
| 5,893,730 A | 4/1999 | Yamazaki et al. | |

(Continued)

FOREIGN PATENT DOCUMENTS

JP    58-218169    12/1983

(Continued)

OTHER PUBLICATIONS

Furue et al., "Characteristics and Driving Scheme of Polymer—Stabilized Monostable FLCD Exhibiting Fast Response Time and High Contrast Ratio with Gray-Scale Capability," SID 98 DIGEST, pp. 782-785.

(Continued)

*Primary Examiner*—George Eckert
*Assistant Examiner*—Mursalin B. Hafiz
(74) *Attorney, Agent, or Firm*—Eric J. Robinson; Robinson Intellectual Property Law Office, P.C.

(57) ABSTRACT

To provide a TFT that can operate at a high speed by forming a crystalline semiconductor film while controlling the position and the size of a crystal grain in the film to use the crystalline semiconductor film for a channel forming region of the TFT. Instead of a metal or a highly heat conductive insulating film, only a conventional insulating film is used as a base film to introduce a temperature gradient. A level difference of the base insulating film is provided in a desired location to generate the temperature distribution in the semiconductor film in accordance with the arrangement of the level difference. The starting point and the direction of lateral growth are controlled utilizing the temperature distribution.

24 Claims, 26 Drawing Sheets

U.S. PATENT DOCUMENTS

| | | | |
|---|---|---|---|
| 5,923,962 A | 7/1999 | Ohtani et al. | |
| 6,043,512 A | 3/2000 | Adachi | |
| 6,215,154 B1 | 4/2001 | Ishida et al. | |
| 6,245,602 B1 | 6/2001 | Ho et al. | |
| 6,274,462 B1 | 8/2001 | Fiorini et al. | |
| 6,323,069 B1 * | 11/2001 | Yamazaki et al. | 438/160 |
| 6,358,766 B1 | 3/2002 | Kasahara | |
| 6,410,368 B1 | 6/2002 | Kawasaki et al. | |
| 6,492,659 B1 | 12/2002 | Yamazaki et al. | |
| 6,521,912 B1 * | 2/2003 | Sakama et al. | 257/57 |
| 6,576,534 B1 * | 6/2003 | Zhang et al. | 438/486 |
| 6,599,788 B1 | 7/2003 | Kawasaki et al. | |

FOREIGN PATENT DOCUMENTS

| | | | |
|---|---|---|---|
| JP | 06-005862 | | 1/1994 |
| JP | 406029321 A | * | 2/1994 |
| JP | 07-130652 | | 5/1995 |
| JP | 07131029 A | * | 5/1995 |
| JP | 10-135468 | | 5/1998 |
| JP | 10-135469 | | 5/1998 |

OTHER PUBLICATIONS

Yoshida et al., "A Full-Color Thresholdless Antiferroelectric LCD Exhibiting Wide Viewing Angle with Fast Response Time," SID 97 DIGEST, pp. 841-844.

Terada et al., "Half-V Switching Mode FLCD," Proceeding of the 46th Applied Physics Association Lectures, 28P-V-8, p. 1316, Mar. 1999.

R. Ishihara et al., "Location Control of Large Grain Following Excimer-Laser Melting of Si Thin-Films," Japanese Journal of Applied Physics, vol. 37, No. 3B, pp. 1071-1075, 1998.

K. Shimizu et al., "High-mobility Poly-Si Thin-Film Transistors Fabricated by a Novel Excimer Laser Crystallization Method," IEEE Transactions an Electron Devices, vol. 40, No. 1, 1993.

Ishihara et al., "Location-Controlled Adjacent Grains Following Excimer-Laser Melting of Si Thin-Films," 1998, pp. 153-156, AM-LCD.

* cited by examiner

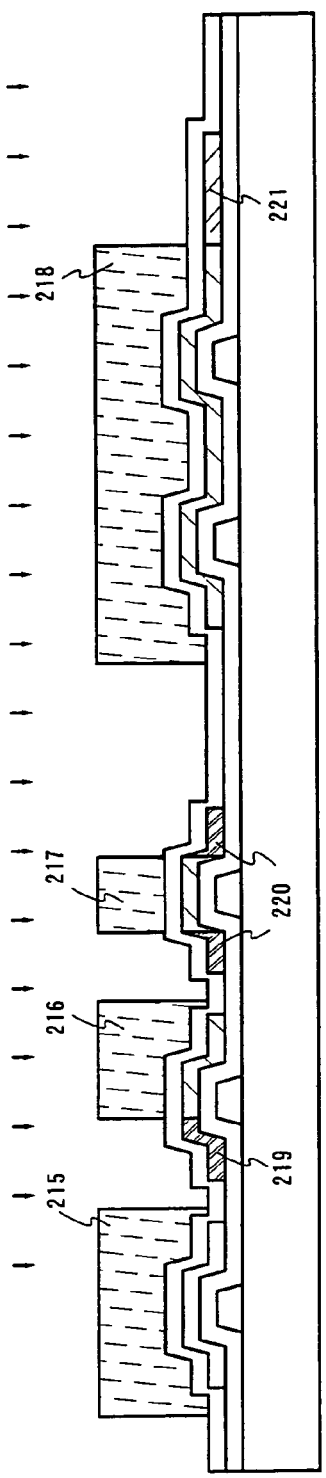
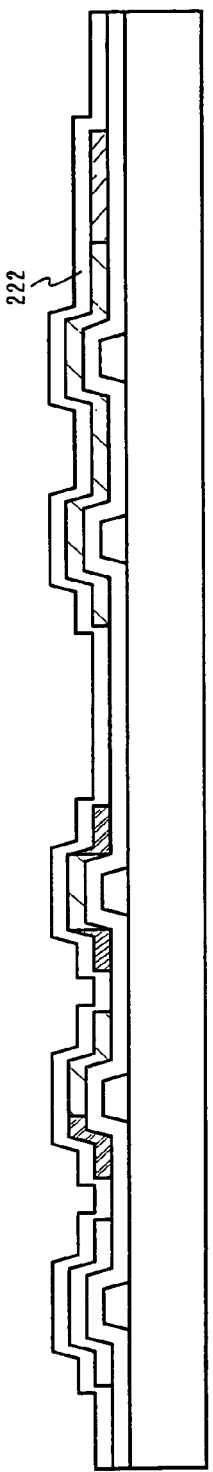
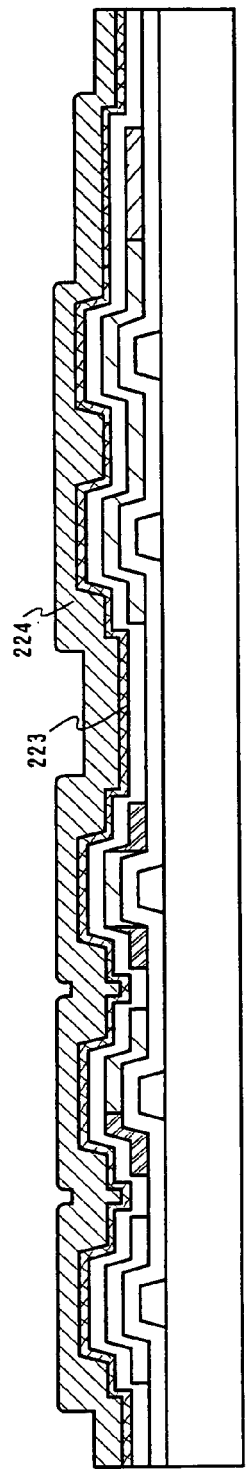
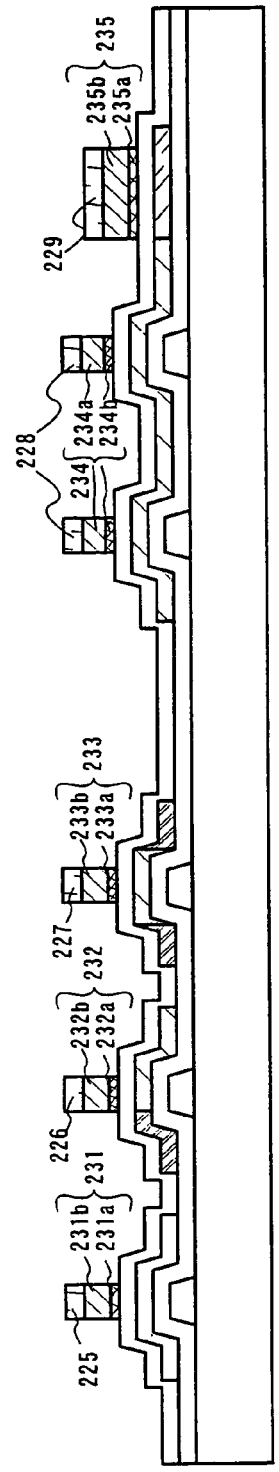
Fig. 10A
Fig. 10B
Fig. 10C
Fig. 10D

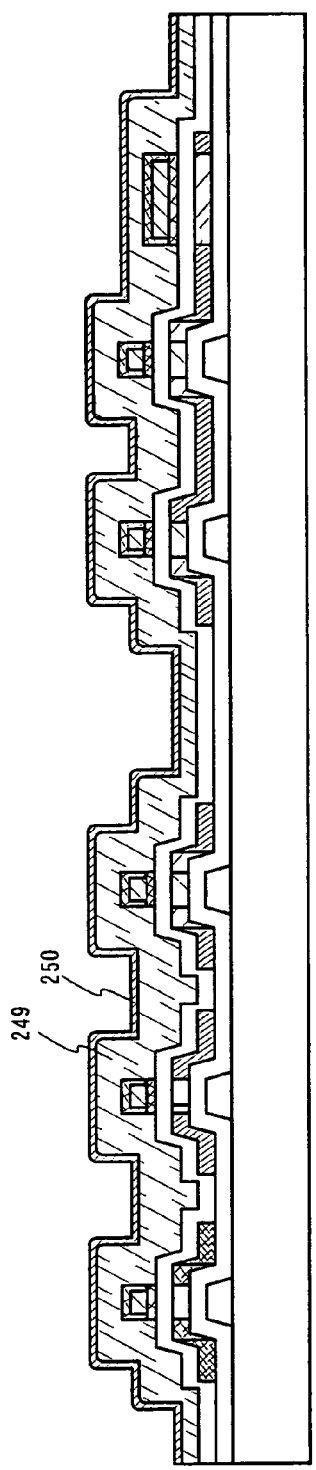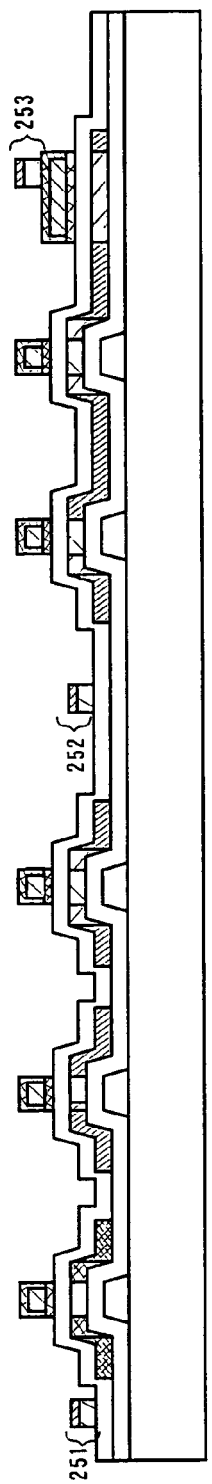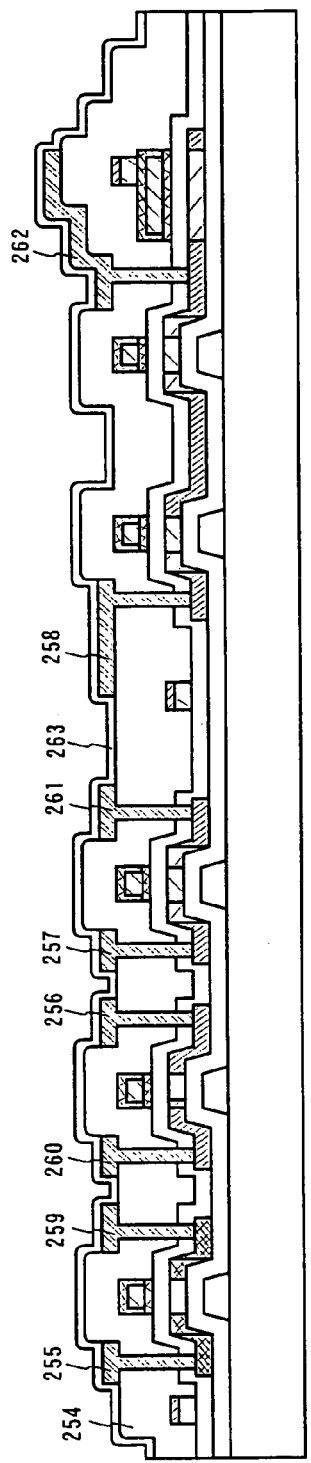
Fig. 12A
Fig. 12B
Fig. 12C

SEMICONDUCTOR DEVICE AND A METHOD OF MANUFACTURING THE SAME

BACKGROUND OF THE INVENTION

1. Field of the Invention

The present invention relates to a method of manufacturing a semiconductor film that is formed on a substrate having an insulating surface and that has a crystal structure, and to a method of manufacturing a semiconductor device using this semiconductor film as an active layer. More specifically, the present invention relates to a semiconductor device using a crystalline semiconductor film as an active layer and to an electronic apparatus using the semiconductor device as a display unit.

2. Description of the Related Art

In recent years, some have sought advantage in forming a channel forming region from a single crystal, which has less defects, with regard to improvement in mobility of low temperature polycrystalline silicon and to drop in $I_{off}$. A related technology has thus been developed which includes forming an amorphous semiconductor film on a light transmissive substrate with an insulating surface, and crystallizing the film by laser annealing, thermal annealing, etc., to use the obtained crystalline semiconductor film as an active layer of a thin film transistor (hereinafter referred to as TFT).

Laser annealing is known as a crystallizing technology capable of imparting high energy only to an amorphous semiconductor film to crystallize the film. In particular, an excimer laser emitting shortwave light of 400 nm wavelength or less is a representative laser that has been used since early stages of development of laser annealing echnology. In addition to the excimer laser annealing, a technique using YAG laser which is a solid state laser has been developed lately. In the laser annealing mentioned above, a laser beam is processed by an optical system so as to take a spot-like shape or a linear shape on an irradiation surface, and the irradiation surface on a substrate is scanned with the processed laser light (irradiation position of laser light is moved relative to the irradiation surface). For instance, excimer laser annealing using linear laser light is capable of annealing the entire irradiation surface with laser by merely scanning in one direction that is perpendicular to the longitudinal direction of the surface. The excimer laser annealing using linear laser light is thus superior in productivity and is becoming the mainstream in techniques of manufacturing liquid crystal display devices using TFTs. This laser annealing technique has realized a monolithic type liquid crystal display device in which TFTs constituting a pixel portion (pixel TFT) and TFTs constituting driver circuits provided in the periphery of the pixel portion are formed on one glass substrate.

However, the crystalline semiconductor film formed by laser annealing is an accumulation of plural crystal grains, and the crystal grains are positioned at random in the film and the size thereof is irregular. In the TFT fabricated on the glass substrate, the crystalline semiconductor film is divided and formed into an island-like pattern with the intention of partitioning elements. It is therefore impossible to form the TFT with the position and the size of crystal grains specified. The interface of the crystal grains (crystal grain boundary) has a recombination center and a trapping center caused by the amorphous structure, crystal defects, etc., which are factors in degrading the current transportation characteristic of carriers. The potential level in the crystal grain boundary also affects this characteristic.

The crystallinity of a semiconductor film in a channel forming region has a great influence on a TFT characteristic. However, it is almost impossible to form the channel forming region from a single crystal semiconductor film while removing the adverse influence of the crystal grain boundary.

Attempts at growing the crystal grains larger have been made in order to solve this problem. For instance, a method of laser annealing has been reported in "High-Mobility Poly-Si Thin-Film Transistors Fabricated by a Novel Excimer Laser Crystallization Method", K. Shimizu, O. Sugiwara and M. Matsumura, IEEE Transactions on Electron Devices, vol. 40, No. 1, p.p. 112–117, 1993. According to the method, a three-layer film consisting of Si, $SiO_2$, and Si is formed on the substrate and both sides of the device, i.e., the three-layer film side and the substrate side, are irradiated with excimer laser light. The article states that the method is capable of enlarging the size of the crystal grains by laser light irradiation with a certain energy intensity.

The method proposed by K. Shimizu et al., is characterized in that a thermal characteristic of a base material of an amorphous silicon film is changed locally to control the heat flow to the substrate and to introduce a temperature gradient. In order to introduce the temperature gradient, a three-layer structure consisting of a high melting point metal layer, a silicon oxide layer, and a semiconductor film is formed on a glass substrate. Structurally speaking, to fabricate a top gate type TFT with this semiconductor layer as an active layer is not impossible. However, the silicon oxide film provided between the semiconductor film and the high melting point metal film generates parasitic capacitance and increases power consumption, making it difficult to obtain a TFT operating at a high speed.

Other methods such as a method that uses lasers having a phase difference and the step irradiation method, also have a problem and require a complicated laser apparatus. In addition, when applied to crystallization of driving elements of a liquid crystal panel having a driver circuit incorporated therein, the methods may not always be successful in enabling all part of the channel forming region to have a large grain, nor in crystallizing them into a single crystal, for the elements are usually arranged irregularly, not with regular intervals.

There is another method that is a combination of the dual beam method and the three-layer island structure. (The dual beam method is a method in which an amorphous semiconductor film is crystallized by irradiating each side of a substrate with a laser, or by irradiating one side of a substrate with a laser and then irradiating the other side of the substrate with the laser transmitted through the substrate and reflected by a mirror or the like.) When applied to crystallization of driving elements of a liquid crystal panel having a driver circuit incorporated therein, the combination method is capable of crystallizing a designated site into a single crystal, but is not good at growing a crystal grain to as large a grain size as 5 μm or more. Therefore the method is not suitable for manufacturing a thin film transistor whose channel width is wide. The method also generates a parasitic capacitance between a metal and Si, causing signal delay. Furthermore, the method has a problem of peeling because the temperature sometimes reaches high at a time of irradiation depending on the metal material used.

A method in which a base film is formed from a highly heat conductive insulating film has an advantage in that a parasitic capacitance is not generated between the metal and Si. However, the method requires a development of a highly heat conductive insulating film that is stable.

SUMMARY OF THE INVENTION

The present invention discloses techniques for solving these problems. An object of the present invention is to provide a TFT that can operate at a high speed by forming a crystalline semiconductor film while controlling the position and the size of a crystal grain in the film to use the crystalline semiconductor film for a channel forming region of the TFT. Another object of the present invention is to provide a technique of applying this TFT to various semiconductor devices such as a transmission type liquid crystal display device and a display device that uses an electroluminescence material.

In order to attain the objects above, the present invention uses, instead of a metal or a highly heat conductive insulating film, only a conventional insulating film formed on a substrate such as a glass substrate in forming a level difference. The level difference sets a temperature gradient, which is utilized in crystallizing an amorphous semiconductor layer by laser annealing. According to the laser annealing of the present invention, a pulse emitting type or continuous light emitting type excimer laser, YAG laser or argon laser is used as a light source. Laser light emitted from the light source is formed into a linear shape or a rectangular shape by an optical system, and the linear or rectangular laser light is used to irradiate an island-like semiconductor layer. The island-like semiconductor layer is irradiated with the laser from the front side of the substrate (the front side is defined herein as a side where the island-like semiconductor layer is formed), or from both the front side and back side of the substrate (the back side is defined herein as a side opposite to the side where the island-like semiconductor layer is formed).

Following the technique of the present invention, the base insulating film is patterned to form an island-like insulating film, and the level difference caused by this island-like insulating film sets the temperature gradient in carrying out the crystallization. Thermal analysis in this crystallization has been simulated, obtaining results shown in FIG. 5B. The level difference herein designates a convex portion provided in the base insulating film as shown in FIGS. 4A to 4C, or a difference in height between the top (a portion corresponding to a region A in FIG. 1C) and the bottom (a portion corresponding to a region B in FIG. 1C) in an uneven semiconductor film surface caused by the island-like insulating film.

The temperature gradient is supposedly responsible for the results as such. In the region B, heat escapes into 1) a part of the base insulating film right beneath the region B and 2) another part of the base insulating film beside the region B. Therefore, the region B cools faster than other regions. Conversely, a region C receives the heat escaping from the region B and hence is slow to cool down. The temperature gradient is thus generated between the region B and the region C.

Next, an explanation is given of how the semiconductor film is melted completely and then crystallized by the laser light irradiation. Solidification begins first in the region B where the temperature drops most rapidly from the reason mentioned above, and a crystal nuclear is generated. This nuclear serves as the center of crystal growth, and the crystal growth proceeds toward the region C or the region A where the temperature is high and the semiconductor film is in a molten state.

If the semiconductor film is not completely melted by the laser light irradiation and a part thereof remains solid, the solid part (minute solid phase) serves as the center of the crystal growth and the crystal growth proceeds from the center following the temperature gradient. It is thus possible to control the crystal growth so that a crystal having a large grain size is formed in a designated site.

As described above, the base insulating film can be utilized as a heat storage layer or a heat capacity gradient at a desired location and, to do so, forming a highly heat conductive film on the substrate is not necessary. Instead, a structure consisting of a semiconductor film, a base insulating film and a substrate, which has been employed in a conventional TFT formed on a glass substrate, is suffice. The base insulating film in this structure is patterned to have a desired shape and form the level difference. It is thus possible to control the starting point and the direction of lateral growth by utilizing the temperature distribution in the semiconductor film which corresponds to the arrangement of the level difference.

BRIEF DESCRIPTION OF THE DRAWINGS

In the accompanying drawings:

FIGS. 10A to 10D are diagrams showing the process of manufacturing the TFTs for the pixel portion and the driver circuit portion;

FIGS. 12A to 12C are diagrams showing the process of manufacturing the TFTs for the pixel portion and the driver circuit portion;

DETAILED DESCRIPTION OF THE PREFERRED EMBODIMENTS

Embodiment Mode 1

Figure 1A:
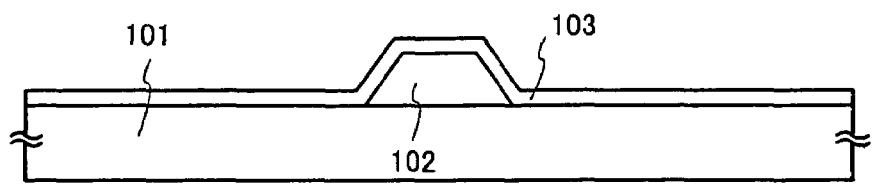
FIGS. 1A to 1C are diagrams illustrating a crystallization process according to the present invention.

Embodiment mode of the present invention will be described with reference to FIGS. 1 and 2. In FIG. 1A, a non-alkali glass substrate made of barium borosilicate glass, aluminoborosilicate glass, or the like is used as a substrate 101. For example, #7059 glass, #1737 glass, or the like manufactured by Corning Incorporated can be preferably used.

An insulating film, which have light transparency and an insulating property, is formed on the surface of the substrate 101 on which a TFT is formed and the insulating film is patterned to form an island-like insulating film 102. The island-like insulating film may be formed of a material excellent in heat conductivity. In this case, it is desirable that the heat conductivity is 10 $Wm^{-1}K^{-1}$ or more. As such a material, an aluminum oxide ($Al_2O_3$) is suitable due to its transparency to visible light and a heat conductivity of 20 $Wm^{-1}K^{-1}$. Furthermore, aluminum oxide is not limited to a stoichiometric ratio, and hence, another element may be added thereto so as to control characteristics such as heat conductivity and an internal stress. For example, nitrogen may be added to aluminum oxide to use aluminum oxide nitride ($AlN_xO_{1-x}$: $0.02 \leq x \leq 0.5$). Alternatively, an aluminum nitride ($AlN_x$) may be used. Furthermore, a compound containing silicon (Si), oxygen (O), nitrogen (N), and M (M is aluminum (Al) or at lest one selected from rare-earth elements) may be used. For example, AlSiON, LaSiON, and the like can preferably be used. In addition, boron nitride can also be used.

The above-mentioned oxide, nitride, and compound can be formed by sputtering, plasma CVD (chemical vapor deposition), or the like. In the case of sputtering, a target having a desired composition and inert gas such as argon (Ar) or nitrogen (N) are used. Furthermore, a thin film diamond layer or a DLC (diamond like carbon) layer having a heat conductivity of 1000 $Wm^{-1}K^{-1}$ may be provided. In any case, the insulating film 102 is formed to a thickness of 50 to 500 nm, (preferably 200 nm), using such a material, whereby a temperature increase due to irradiation with laser light can be suppressed. Furthermore, the side walls on the end surfaces of the insulating film 102 is tapered by etching so as to have an angle of 5 degrees to less than 50 degrees with respect to the main surface of the glass substrate 101, whereby step coverage of a film to be formed on the insulating film is ensured.

A base insulating film 103 is formed by using a silicon oxide film, a silicon nitride film, a silicon oxide nitride film, or the like. The silicon oxide nitride film is formed by plasma CVD, using $SiH_4$ and $N_2O$ as material gas. Oxygen ($O_2$) may be added to the material gas. Although there is no limit to production conditions, when a silicon oxide nitride film is used as the base insulating film, it is formed to a thickness of 50 to 500 nm with an oxygen concentration of 55 atomic % to less than 70 atomic % and a nitrogen concentration of 1 atomic % to less than 20 atomic %. In this composition, the internal stress of the silicon oxide nitride film is reduced, and a fixed charge density is reduced.

Figure 1B:
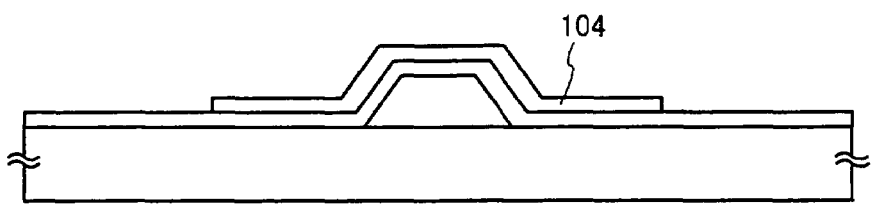
Figure 1C:
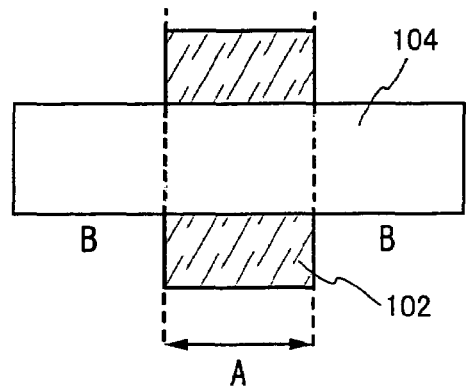

An island-like semiconductor film 104 shown in FIG. 1B is formed to a thickness of 25 to 2000 nm (preferably 30 to 100 nm). The island-like semiconductor film is obtained by forming a semiconductor film having an amorphous structure by a known method such as plasma CVD or sputtering, followed by removing an unnecessary portion by etching. FIG. 1C is a top view of the island-like semiconductor film. The island-like semiconductor film is formed over the island-like insulating film which are patterned to a stripe shape, or a rectangular shape, and disposed so as to vertically cross the island-like base insulating film without allowing the end portions on short sides of the base insulating film to overlap the end portion of the island-like semiconductor film. Examples of a semiconductor film having an amorphous structure for forming the island-like semiconductor film include an amorphous semiconductor film and a microcrystalline semiconductor film. A compound semiconductor film having an amorphous structure such as an amorphous silicon germanium film may be applied.

FIG. 2 illustrates the steps of crystallization by laser annealing according to the present invention.

In the step of crystallization, first, it is desirable to allow hydrogen contained in an amorphous semiconductor film to be released; the amorphous semiconductor film is subjected to heat treatment at 400° C. to 500° C. for about one hour to prescribe the amount of hydrogen to be 5 atomic % or less.

In the case of crystallization by laser annealing, pulse oscillation type or continuous oscillation type excimer laser, YAG laser, or argon laser is used as a light source.

Figure 2A:
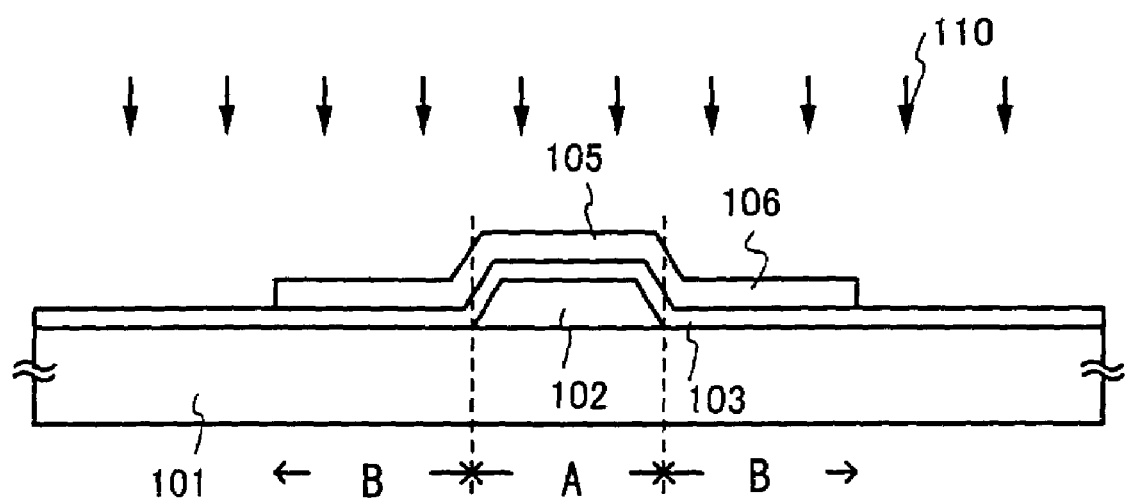
FIGS. 2A to 2B are diagrams illustrating the crystallization process according to the present invention.

FIG. 2A shows a state in which the island-like semiconductor film is irradiated with laser light 110. An island-like semiconductor film 104 is formed along an island-like insulating film 102 and a region A105 denotes a level difference region formed by the island-like insulating film 102 and reference numeral 106 denotes the outside region B. In any case, the island-like semiconductor film is heated by irradiation with laser light, and once melted. It is assumed that crystal nuclei are generated during a cooling step in which the island-like semiconductor film is shifted from a melt state to a solid state. It is empirically known that a nucleus generation density has a correlation with a temperature in the melt state and a cooling speed, and that a nucleus generation density tends to be high when the island-like semiconductor film is rapidly cooled from high temperature.

Referring to a structure shown in FIG. 1A, in a portion where the island-like insulating film 102 is formed, the volume and heat capacity increase, so that a temperature increase due to irradiation with laser light can be suppressed. Furthermore, in the case of using dual beam laser annealing, laser light is irradiated from the substrate side surface of the island-like semiconductor film 104 and the opposite surface thereto and both surfaces are heated; therefore, a cooling speed becomes relatively slow, compared with conventional laser annealing using a single beam. As a result, the direction of lateral growth is suppressed by the temperature distribution in the level difference and crystal nuclei are preferentially generated from portions of the island-like semiconductor film overlapping the island-like insulating film 102, and crystal growth starts therefrom toward the periphery.

Figure 2B:
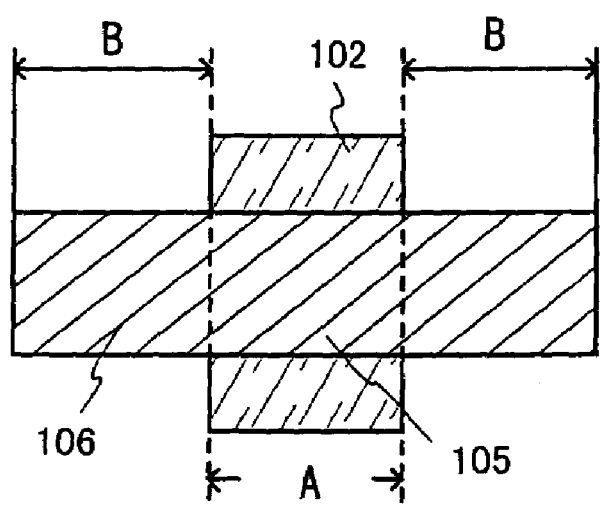

As a result, crystal with a large grain size grows on the periphery of the island-like insulating film 102 whereby crystal with a large grain size is obtained in the region A denoted by reference numeral 105, surrounded by the island-like insulating film 102, and crystal with a relatively small grain size is obtained in the region B denoted by reference numeral 106. FIG. 2B is a top view showing the state of crystal growth. When TFTs are formed, the level difference region becomes the width of a channel forming region. Furthermore, such an effect becomes conspicuous by increasing the number of repetition pulses of pulse laser light to be irradiated.

Thereafter, the island-like semiconductor film is subjected to heat treatment at 300° C. to 450° C. in an atmosphere containing 3 to 100% hydrogen or at 200° C. to 450° C. in an atmosphere containing hydrogen generated by plasma, whereby a remaining defect can be neutralized. By manufacturing an active layer of a TFT, using the region A 105 of the island-like semiconductor film 104 as a channel formation region, the characteristics of the TFT can be enhanced.

Embodiment Mode 2

An island-like semiconductor film having a crystal structure for use as an active layer of a TFT is formed not only by laser annealing, but also by a combination of laser annealing according to the present invention and thermal annealing. In particular, when crystallization by thermal annealing is applied to crystallization using a catalytic element disclosed in Japanese Patent Application Laid-Open No. Hei 7-130652, crystallization can be realized at 600° C. or less. When the crystalline semiconductor film thus formed is treated by laser annealing according to the present invention, a crystalline semiconductor layer of high quality can be obtained. Such an embodiment mode will be described with reference to FIG. 3.

Figure 3A:
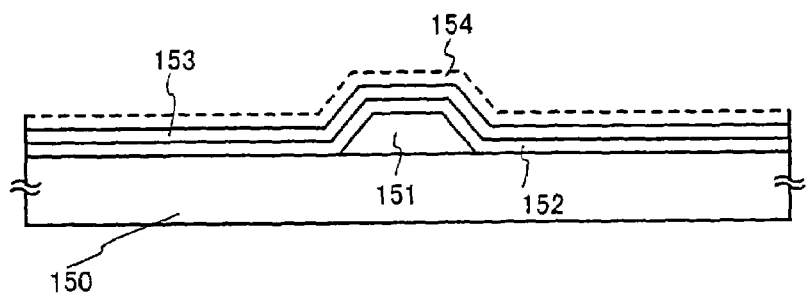
FIGS. 3A to 3C are diagrams illustrating another crystallization process according to the present invention.

In FIG. 3A, a glass substrate shown in Embodiment Mode 1 is preferably used as a substrate 150. An island-like insulating film 151, a base insulating film 152 and an amorphous semiconductor film 153 are formed in the same way as in Embodiment Mode 1. Then, a layer 154 containing a catalytic element is formed by coating with an aqueous solution containing a catalytic element (5 to 100 ppm by weight) by spin coating. Alternatively, the layer 154 containing a catalytic element may be formed by sputtering, vapor deposition, or the like. In this case, the thickness of the layer 154 containing a catalytic element is prescribed to be 0.5 to 2 nm. Examples of the catalytic element include nickel (Ni), germanium (Ge), iron (Fe), palladium (Pd), tin (Sn), lead (Pb), cobalt (Co), platinum (Pt), copper (Cu), and gold (Au).

Figure 3B:
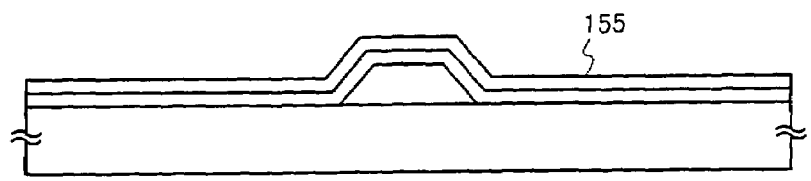

Thereafter, heat treatment is conducted at 400° C. to 500° C. for about one hour, whereby the content of hydrogen in the amorphous semiconductor film is prescribed to be 5 atomic % or less. Then, thermal annealing is conducted at 550° C. to 600° C. for 1 to 8 hours, preferably at 550° C. for 4 hours in a nitrogen atmosphere, using an annealing furnace. Thus, a crystalline semiconductor layer 155 made of a crystalline silicon film can be obtained (FIG. 3B).

Figure 3C:
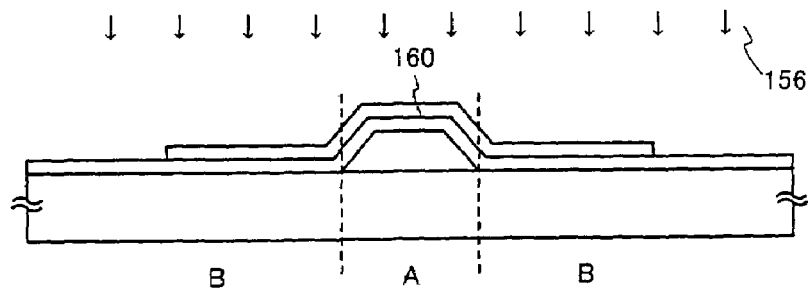
Figure 4A:
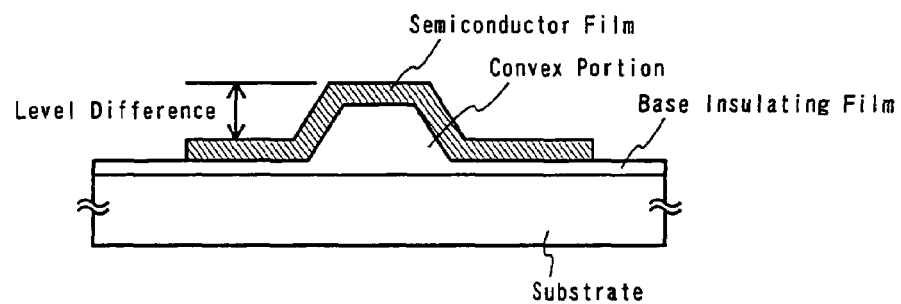
FIGS. 4A to 4C are diagrams showing an example of a mode of the present invention.
Figure 4B:
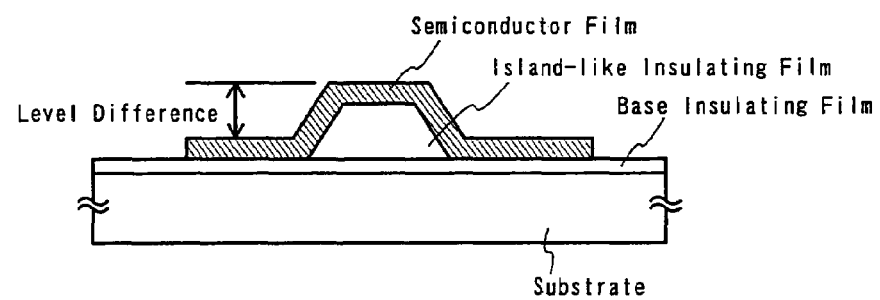
Figure 4C:
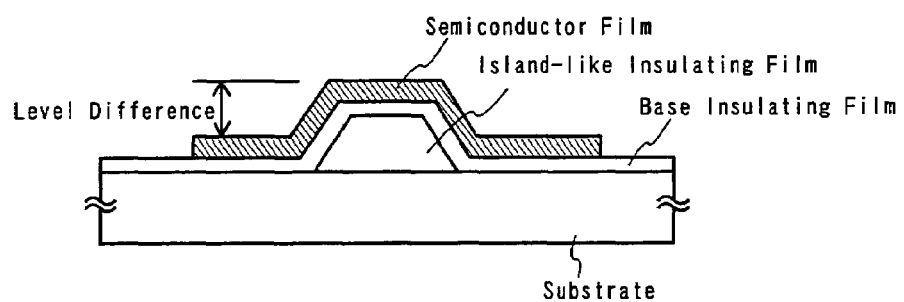
Figure 5A:
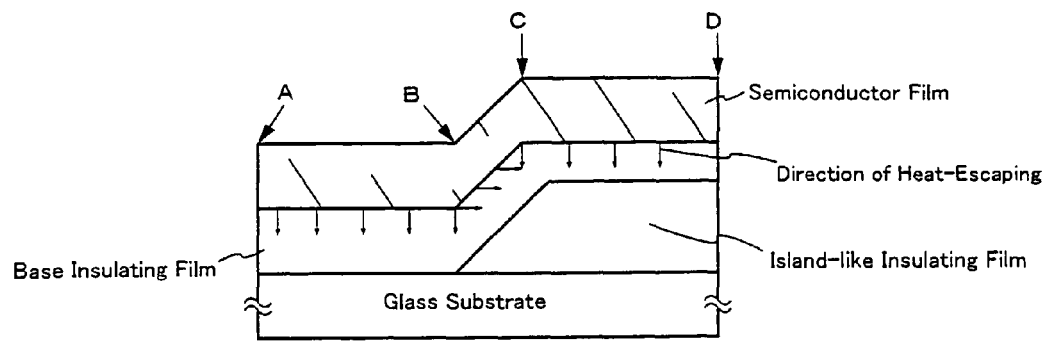
FIGS. 5A and 5B are diagrams regarding a thermal analysis simulation and the results thereof.
Figure 5B:
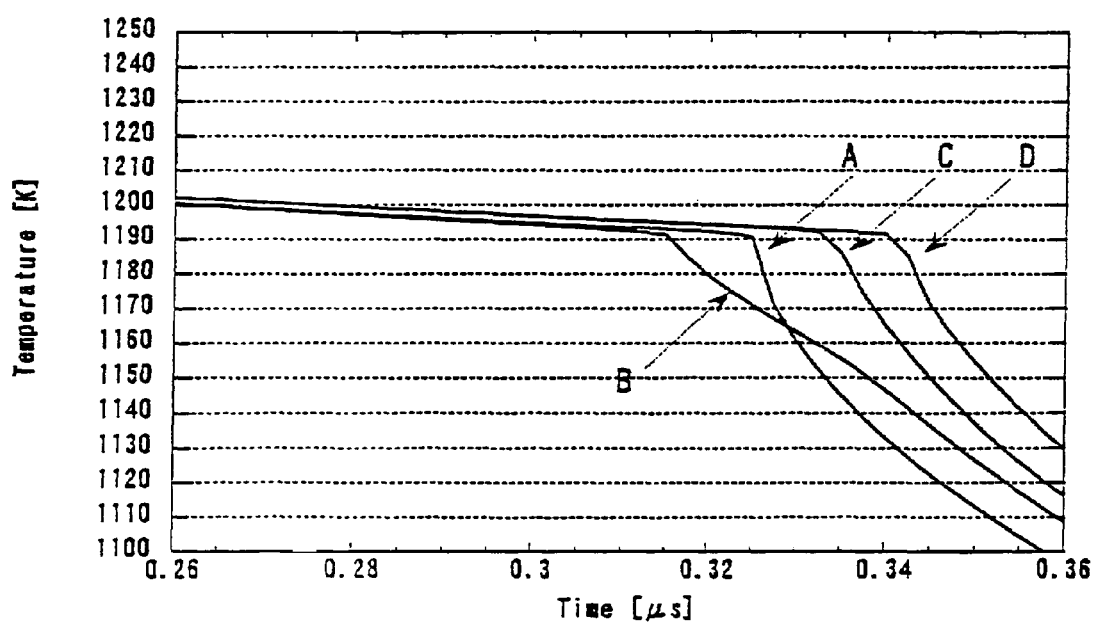

As shown in FIG. 3C, an island-like semiconductor film 160 is formed from the crystalline semiconductor film 155. More specifically, as shown in FIG. 3C, single beam laser annealing is conducted with respect to the substrate in this state. (dual beam laser annealing may be conducted. In the case of using a dual beam annealing, a substrate having transparency may be used.) As a result, the crystalline semiconductor film 155 is once melted by laser light 156 to form an island-like semiconductor film 160 having a crystal structure. In the island-like semiconductor film 160 thus formed, crystal grains with a grain size equal to or larger than that of the island-like semiconductor film 107 shown in FIG. 2 can be formed in a center of the region A. However, a catalytic element is contained in the island-like semiconductor film 560 in a concentration of about $1 \times 10^{17}$ to about $1 \times 10^{19}$ atoms/cm$^3$.

Then, it is possible to reduce the concentration of the catalytic element in the island-like semiconductor film to $1 \times 10^{17}$ atoms/cm$^3$ or less, preferably to $1 \times 10^{16}$ atoms/cm$^3$ or less, by use of techniques disclosed in Japanese Patent Application Laid-Open Nos. Hei 10-135468 and Hei 10-135469.

In the techniques, impurity element belonging to 15 group of periodic table, typically phosphorus, is added into a selected portion of the island-like semiconductor film and a heat treatment is performed in a nitrogen atmosphere at 550 to 800° C. for 5 to 24 hours. Then, the catalytic element remained in the island-like semiconductor film can be moved into the portion at which the phosphorus has been added. After that, the island-like semiconductor film in which the concentration of the catalytic element is reduced to $1 \times 10^{17}$ atoms/cm$^3$ or less can be obtained by removing the portion to which the catalytic element has moved by etching.

Embodiment Mode 3

An insulating film is formed on a substrate in a manner similar to Embodiment Mode 1. The insulating film is then patterned to form an island-like insulating film. The insulating film can take various kinds of shapes. Examples thereof in this embodiment mode are shown in FIGS. 6A to 6E. All of FIGS. 6A to 6E are views viewed from above, and the hatched areas in the figures denote a level difference region generated by the base insulating film.

Figure 6A:
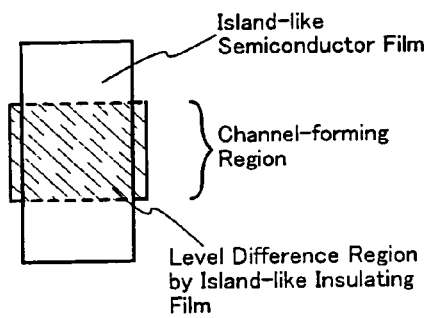
FIGS. 6A to 6G are top views showing various shapes of an island-like insulating film.

In FIG. 6A, the insulating film is patterned to form a rectangular having a width (a portion corresponding to a channel forming region) of 2 to 5 μm, with the intention of causing lateral growth within the level difference region.

In FIG. 6A, a lateral growth toward the channel length direction, which utilizes the temperature gradient caused by the island-like insulating film formed so as to intersect with a semiconductor film, is combined with a lateral growth toward the channel width direction, which utilizes the temperature gradient generated at its edge by forming the semiconductor film into an island-like shape. This makes it possible to enlarge the grain size at any site.

Figure 7A:
FIGS. 7A and 7B are diagrams showing the results of observation of crystallization by SEM.
Figure 7B:

FIGS. 7A and 7B show the results of SEM observation of a crystal state when the island-like insulating film is formed into a rectangular with a width of 5 μm and then crystallized. It is apparent in the figures that the proceeding of the crystal growth starts from the edge of the level difference region caused by the island-like insulating film and from the edge of the island-like semiconductor film.

Figure 6B:
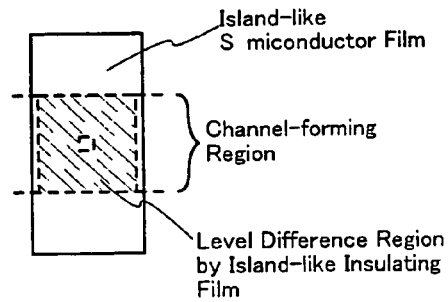

If an aperture is formed inside the rectangular base insulating film as shown in FIG. 6B, the crystal growth also starts from the aperture and advances outward, improving the crystallization.

Figure 6C:
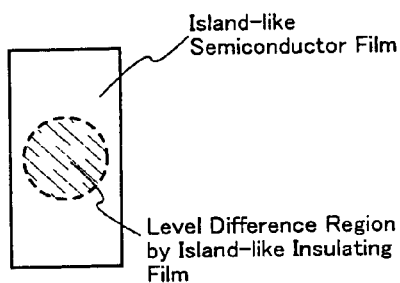

In FIG. 6C, the insulating film is patterned to have a circular shape, so that the lateral growth proceeds radially with the level difference region as the center of the crystal grain growth. The diameter of the circular insulating film is 1.0 to 2.0 μm. When the diameter thereof is set to about 1 μm, it is possible to suppress the lateral growth in accordance with the temperature gradient in the level difference region.

Figure 8A:
FIGS. 8A and 8B are diagrams showing the results of observation of crystallization by SEM.
Figure 8B:
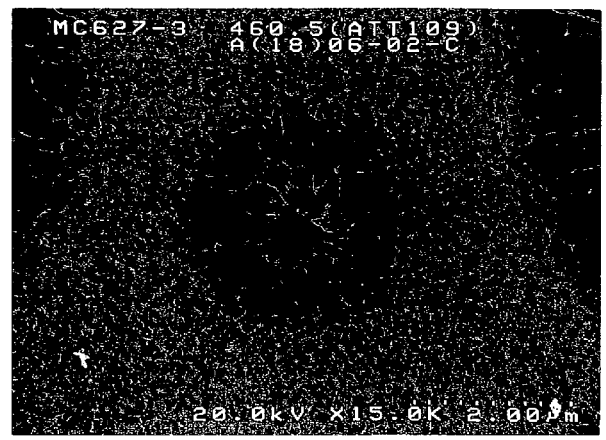

FIGS. 8A and 8B show the results of SEM observation of the crystal growth in the columnar level difference region (the region is designed to have a diameter of 2 μm). It is confirmed by FIGS. 8A and 8B that the lateral growth proceeds radially with the columnar level difference region as the center.

Figure 6D:
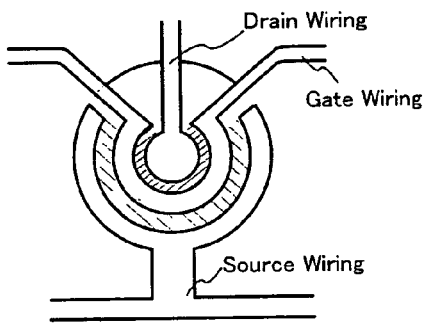

Shown in FIG. 6D is a TFT manufactured by crystallization in which the insulating film is patterned to have a columnar shape as shown in FIG. 6C.

Figure 6E:
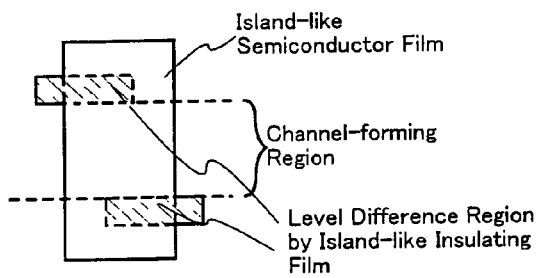

In FIG. 6E, the lateral growth proceeds from the inner edge of the level difference region caused by one of a pair of island-like insulating films toward the other island-like insulating film of the pair. In order to avoid a collision between the lateral growth heading toward the opposite directions at the middle, the island-like insulating film formed into a slip-like shape partially overlaps with the island-like semiconductor film so that the island-like insulating films and the island-like semiconductor film are provided alternately.

Figure 6F:
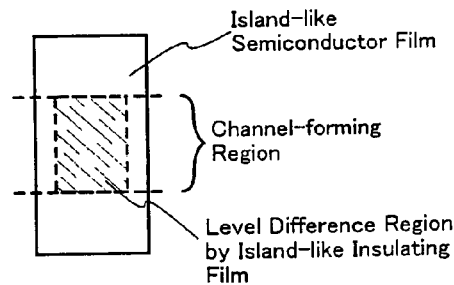

As shown in FIG. 6F, an organic resin film having a low heat conductivity, such as a BCB (benzocyclobutene) film, may also be used as a material for the level difference region in order to increase the crystal growth by slowing the cooling rate without changing the temperature distribution that utilizes the level difference caused by the island-like insulating film.

Figure 6G:
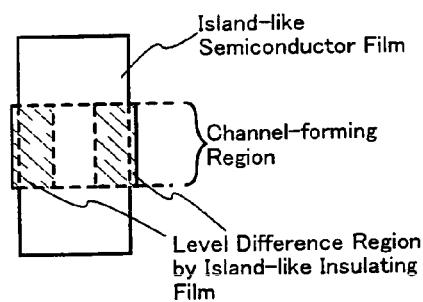

FIG. 6G shows an example of forming the level difference region near the longer side edge of the semiconductor film so as not to step over the edge of the semiconductor film, or to slightly overlap with the semiconductor film. The distance between the pair of island-like insulating films may be set suitably by a person who intends to carry out the present invention. This causes the edge of the semiconductor film to cool faster than usual, drawing a sharp temperature difference between the edge of the semiconductor film and the inside thereof. The lateral growth is thus promoted.

The patterns of the island-like insulating film described in the above can be employed by both Embodiment Mode 1 and Embodiment Mode 2.

Embodiment 1

The present invention will be described by way of an embodiment with reference to FIGS. 9 to 12. In this embodiment, a method of simultaneously manufacturing an n-channel TFT (hereinafter, referred to as a pixel TFT) and a storage capacitor for a pixel portion, and an n-channel TFT and a p-channel TFT for a driver circuit provided on the periphery of the pixel portion will be described in accordance with the steps.

In FIG. 9, #1737 glass manufactured by Corning Incorporated can be used as a substrate 201. On the surface of the substrate 201 where TFTs are to be formed, a base insulating film is formed. The film is formed of a silicon oxide film, a silicon nitride film, a silicon oxide nitride film, or the like.

In the case of using a silicon oxide film, it can be formed by plasma CVD, using a mixture of tetraethyl ortho silicate (TEOS) and oxygen ($O_2$), under the conditions of a reaction pressure of 40 Pa, a substrate temperature of 300° C. to 400° C., and a power density of 0.5 to 0.8 W/cm² at a high frequency of 13.56 MHz. In the case of using a silicon oxide nitride film, it can be formed of $SiH_4$, $N_2O$, and $NH_3$, or $SiH_4$ and $N_2O$ by plasma CVD under the conditions of a reaction pressure of 20 to 200 Pa, a substrate temperature of 300° C. to 400° C., a power density of 0.1 to 1.0 W/cm² at a high frequency of 60 MHz. Furthermore, a hydrogenated silicon oxide nitride film formed of $SiH_4$, $N_2O$, and $H_2$ may also be used. A silicon nitride film may also be formed of $SiH_4$ and $NH_3$ by plasma CVD.

The base insulating films represented by the above description is formed to a thickness of 20 to 200 nm (preferably 30 to 60 nm) over the entire surface of the substrate 201, and forming a resist mask, followed by etching an unwanted portion by photolithography to form a predetermined pattern. An insulating film is patterned in a rectangular shape to form island-shape insulating films 202 to 206. Dry etching using fluorine type gas or wet etching using a fluorine type aqueous solution may be used with respect to the insulating film. In the case of selecting the latter method, a mixed solution (LAL 500 manufactured by Stella Chemifa Kabushiki Kaisha) containing 7.13% ammonium bifluoride ($NH_4HF_2$) and 15.4% ammonium fluoride ($NH_4F$) can be used for etching.

A pattern size of the island-like insulating films 202 to 206 is appropriately determined by those skilled in the art; however, actually, it can be determined considering the size (channel length, channel width) of a TFT to be formed. In this embodiment, as described in FIG. 6A of Embodiment Mode 3, an island-like insulating film having a width of 5 μm is formed, however, the island-like insulating film can be formed in various shapes as shown in Embodiment Mode 3.

Then, a base insulating film 207 covering the island-like insulating film is formed. The film is formed of a silicon oxide film, a silicon nitride film, a silicon oxide nitride film, or the like so as to have a thickness of 50 to 300 nm (preferably, 100 to 200 nm) in the same way as in the island-like insulating film.

Then, a semiconductor film 208 having an amorphous structure is formed to a thickness of 25 to 2000 nm (preferably, 30 to 100 nm) by a known method such as plasma CVD and sputtering. In this embodiment, an amorphous silicon film is formed to a thickness of 55 nm by plasma CVD. Examples of a semiconductor film having an amorphous structure include an amorphous semiconductor film and a microcrystalline semiconductor film. A compound semiconductor film having an amorphous structure such as an amorphous silicon germanium film may be used. Furthermore, since the base insulating film 207 and the amorphous silicon film 208 can be formed by plasma CVD, both layers may be continuously formed under a reduced pressure. After the base insulating film 207 is formed, by not being exposed to the atmosphere, so that its surface can be prevented from contamination, resulting in a decrease in variations of characteristics of TFTs to be formed and a decrease in fluctuation of a threshold voltage.

Figure 9A:
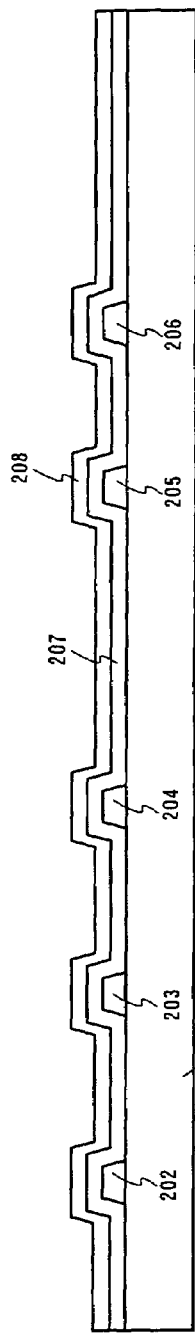
FIGS. 9A to 9D are diagrams showing a process of manufacturing TFTs for a pixel portion and a driver circuit portion.
Figure 9B:
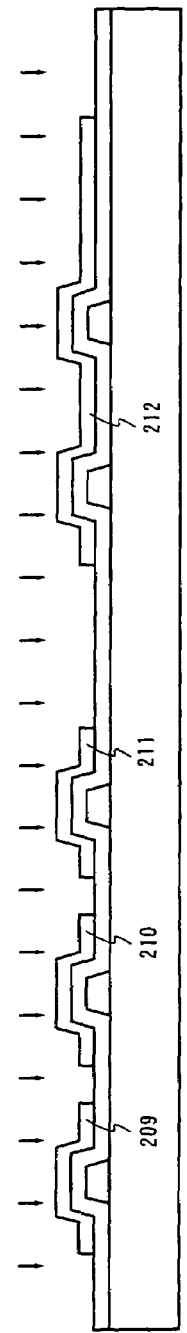

As shown in FIG. 9B, an unwanted portion of the amorphous semiconductor film 208 is removed by etching to form island-like semiconductor films 209 to 212. The shape and size of the island-like semiconductor films may be appropriately determined by those skilled in the art.

The island-like semiconductor films 209 to 212 are crystallized by single beam laser annealing. Any method described in Embodiment modes 1 and 2 may be applied. For example, irradiation of laser light is conducted by using XeCl excimer laser (wavelength: 308 nm) as a laser light generating apparatus and forming linear laser light by an optical system in the laser annealing apparatus, under the conditions of an oscillation frequency of 5 to 50 Hz, an energy density of 100 to 500 mJ/cm², and an overlapping ratio of linear beam of 80 to 98%. In this manner, the island-like semiconductor films 209 to 212 are formed by crystallization.

Figure 9C:
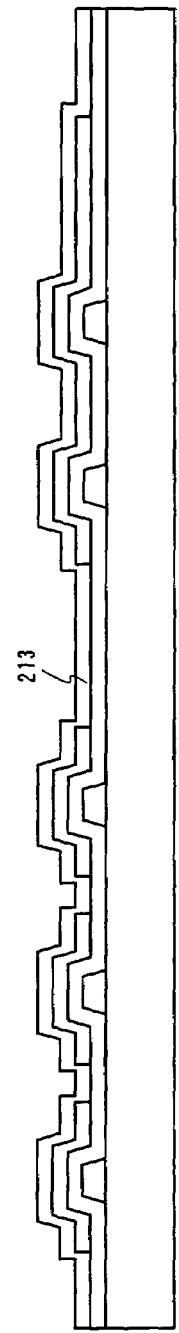

Thereafter, a mask layer 213 of a silicon oxide film having a thickness of 50 to 100 nm is formed by plasma CVD, low pressure CVD, or sputtering. For example, the silicon oxide film is formed by low pressure CVD, using a mixed gas of $SiH_4$ and $O_2$ at 266 Pa and 400° C. (FIG. 9C).

In channel doping process, a photoresist mask 15 is provided, and boron (B) is added as a p-type impurity element in a concentration of about $1\times10^{16}$ to $5\times10^{17}$ atoms/$cm^3$ over the entire surface of the island-like semiconductor films 209 to 212 on which n-channel TFTs are to be formed. Boron (B) may be added by ion doping or may be added when the amorphous silicon film is formed. Channel doping is conducted for the purpose of controlling a threshold voltage. Channel doping is not a required step for manufacturing a TFT; however, it is preferable to conduct channel doping in order to put a threshold voltage of an n-channel TFT in a predetermined range (FIG. 9D).

Then, in order to form an LDD region of an n-channel TFT for a driver circuit, an n-type impurity element is selectively added to the island-like semiconductor films 210 and 211. In this case, photoresist masks 215 to 218 are previously formed. In this step, in order to add phosphorus (P), ion doping is conducted using phosphine ($PH_3$). The concentration of phosphorus (P) in impurity regions ($n^-$) 219, 220 and 221 to be formed is prescribed to be $5\times10^{17}$ to $5\times10^{18}$ atoms/$cm^3$ (FIG. 10A). Furthermore, an impurity region 221 is a semiconductor film for forming a storage capacitor for a pixel portion. It is recommended that phosphorus (P) should be added to this region in the same concentration so as to enhance conductivity.

Figure 9D:
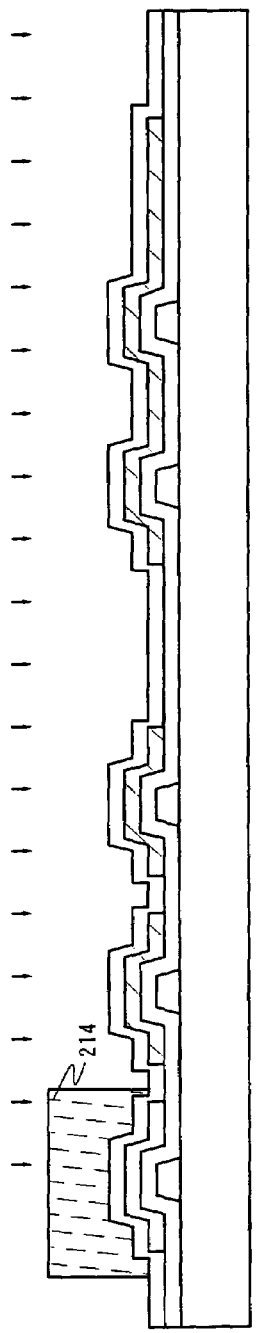

Next, the mask layer 213 is removed by hydrofluoric acid or the like to activate impurity elements added in FIGS. 9D and 10A. Activation can be conducted by thermal annealing or laser annealing at 500° C. to 600° C. for 1 to 4 hours in a nitrogen atmosphere. A combination of thermal annealing and laser annealing may be used. In this embodiment, activation is conducted by using laser. More specifically, the entire surface of the substrate with the island-like semiconductor films formed thereon is scanned with a linear light beam formed from KrF excimer laser light (wavelength: 248 nm) under the conditions of an oscillation frequency of 5 to 50 Hz, an energy density of 100 to 500 light are not particularly limited, and can be appropriately determined by those skilled in the art.

A gate insulating film 222 is formed of an insulating film containing silicon with a thickness of 40 to 150 nm by plasma CVD or sputtering. For example, the gate insulating film 222 is formed of a silicon oxide nitride film formed by plasma CVD using $SiH_4$, $N_2O$, and $O_2$ (FIG. 10B).

Next, first conductive layers 223 and 224 for forming a gate electrode and a storage capacitor line is formed. The conductive layers may be formed as a single layer. If required, the first conductive layers may have a layered structure of two layers or three layers. In this embodiment, the conductive layer has a layered structure of a conductive layer (A) 223 made of a conductive metal nitride film and a conductive layer (B) 224 made of a metal film. The conductive layer (B) 224 can be formed of an element selected from the group consisting of tantalum (Ta), titanium (Ti), molybdenum (Mo), and tungsten (W); an alloy mainly containing these elements; or an alloy film containing a combination of the elements (e.g., Mo—W alloy film, Mo—Ta alloy film). The conductive layer (A) 223 is formed of tantalum nitride (TaN), tungsten nitride (WN), titanium nitride (TiN), molybdenum nitride (MoN), or the like. Furthermore, the conductive layer (A) 223 may be formed of tungsten silicide, titanium silicide, molybdenum silicide, or the like. The concentration of impurities in the conductive layer (B) 224 should be reduced so as to decrease resistance.

In particular, the concentration of oxygen should be 30 ppm or less. For example, tungsten (W) can exhibit a specific resistance of 20 $\mu\Omega$cm or less by prescribing the oxygen concentration to be 30 ppm or less.

The thickness of the conductive layer (A) 223 is prescribed to be 10 to 50 nm (preferably 20 to 30 nm), and that of the conductive layer (B) 224 is prescribed to be 200 to 400 nm (preferably 250 to 350 nm). In this embodiment, a TaN film with a thickness of 30 nm and a Ta film with a thickness of 350 nm are formed as the conductive layer (A) 223 and the conductive layer (B) 224, respectively, by sputtering. The TaN film is formed by using a mixed gas of argon (Ar) and nitrogen (N) as sputtering gas and using Ta as a target. The Ta film is formed by using argon (Ar) as sputtering gas. Furthermore, when an appropriate amount of Xe or Kr is added to the sputtering gas, an internal stress of a film to be formed is relaxed to prevent the film from peeling. A Ta film in an α-phase has a resistance of about 20 $\mu\Omega$cm, so that it can be used for a gate electrode; however, a Ta film in a β-phase has a resistance of about 180 $\mu\Omega$cm, so that it is not suitable for the gate electrode. A TaN film has a crystal structure close to an α-phase. Therefore, if a Ta film is formed on the TaN film, a Ta film in an α-phase can be easily obtained. Although not shown, it is effective to form a silicon film doped with phosphorus (P) with a thickness of about 2 to about 20 nm under the conductive layer (A) 223. Because of this, the adhesiveness of the conductive film to be formed on the silicon film is enhanced and oxidation is prevented. Furthermore, an alkali metal element contained in a trace amount in the conductive layer (A) 223 or the conductive layer (B) 224 can be prevented from being diffused to the gate insulating film 222. In any case, the resistance of the conductive layer (B) 224 is preferably set in a range of 10 to 500 $\mu\Omega$cm. (FIG. 10C)

Next, photoresist masks 225 to 229 are formed, and the conductive layer (A) 223 and the conductive layer (B) 224 are etched together to form gate electrodes 231 to 234 and a storage capacitor line 235. In this case, for example, dry etching is performed using a mixed gas of $CF_4$ and $O_2$, or $Cl_2$ at a reaction pressure of 1 to 20 Pa. The gate electrodes 231 to 234 and the capacitor line 235 are formed of a combination of 231a to 235a made of the conductive layer (A) 223 and 231b to 235b made of the conductive layer (B). At this time, the gate electrodes 232 and 233 provided in an n-channel TFT are formed so as to partially overlap the impurity regions 219 and 220 (FIG. 10D). Furthermore, the gate electrodes may be formed only of the conductive layer (B) 224.

Figure 11A:
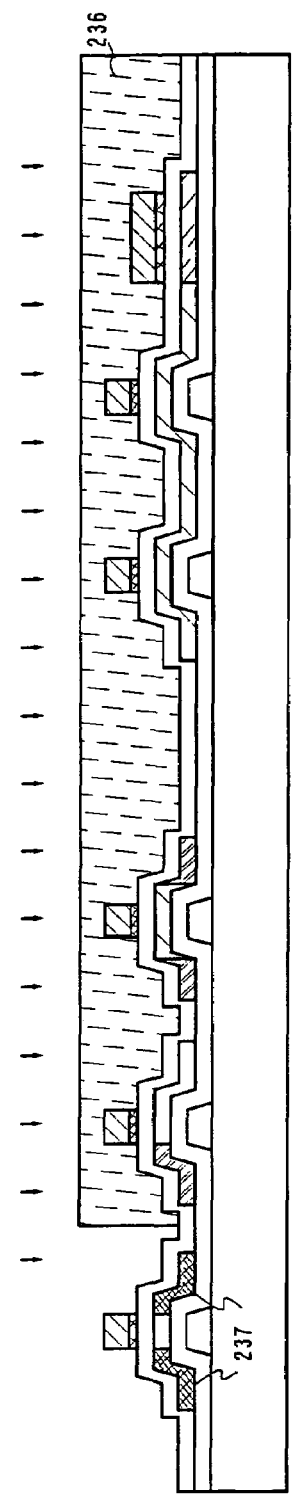
FIGS. 11A to 11D are diagrams showing the process of manufacturing the TFTs for the pixel portion and the driver circuit portion.

Next, in order to form a source region and a drain region of a p-channel TFT for a driver circuit, a p-type impurity element is added. Herein, an impurity region is formed in self-alignment manner, using the gate electrode 231 as a mask. A region where n-channel TFTs are formed is covered with a photoresist mask 236. Then, an impurity region ($p^+$) 237 is formed in a concentration of $1\times10^{21}$ atoms/$cm^3$, using diborane ($B_2H_6$) by ion doping (FIG. 11A).

Figure 11B:
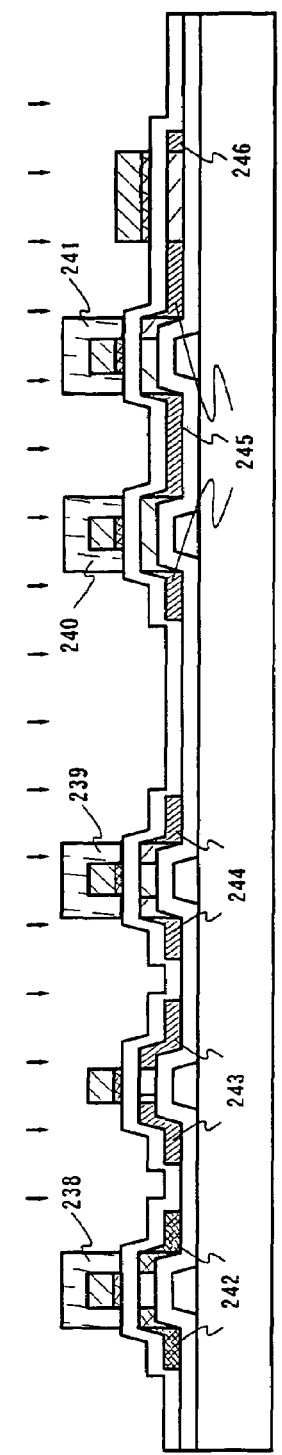

Next, in an n-channel TFT, an impurity region that functions as a source region or a drain region is formed. Resist masks 238 to 241 are formed, and an n-type impurity element is added to form impurity regions 242 to 246. Ion doping using phosphine ($PH_3$) is conducted to form the impurity regions, and the concentration of phosphorus (P) in the impurity regions ($n^+$) 242 to 246 is prescribed to be $5\times10^{20}$ atoms/$cm^3$ (FIG. 11B). The impurity region 242 contains boron (B) added in the previous step; however, phosphorus (P) is added to this region merely in a concentration of ½ to ⅓ of that of boron, so that the influence of the added phosphorus (P) is not required to be considered, and the characteristics of a TFT will not be influenced.

Figure 11C:
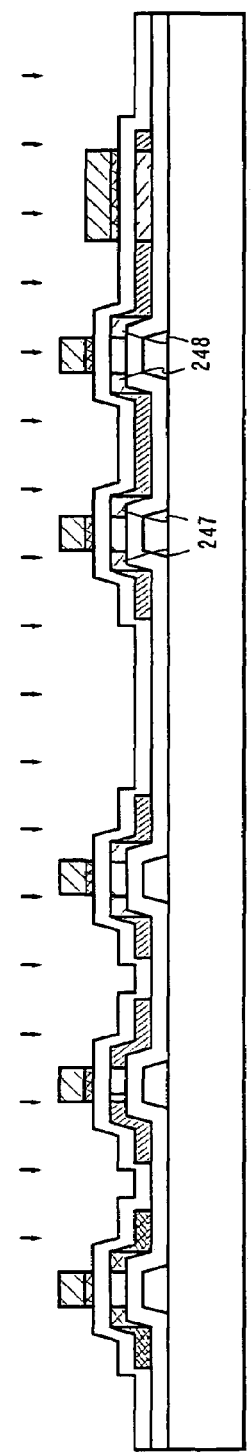

In order to form an LDD region of an n-channel TFT for a pixel portion, an n-type impurity element is added. Herein, an n-type impurity element is added in a self-alignment manner by ion doping using the gate electrode 234 as a mask. The concentration of phosphorus (P) to be added is prescribed to be $5 \times 10^{16}$ atoms/cm$^3$, which is lower than that of the impurity elements added in FIGS. 10A, 11A, and 11B, so that only impurity regions (n$^-$) 247 and 248 are actually formed (FIG. 11C).

Thereafter, heat treatment is conducted in order to activate the n-type or p-type impurity elements added in the respective concentrations. Heat treatment can be conducted by laser annealing method. In this embodiment, activation is conducted by a furnace annealing. Heat treatment is conducted at 400° C. to 700° C., typically 500° C. to 600° C. in a nitrogen atmosphere with an oxygen concentration of 1 ppm or less, preferably 0.1 ppm or less. In this embodiment, heat treatment is conducted at 550° C. for 4 hours.

In the above-mentioned thermal annealing, conductive layers (C) 231c to 235c made of TaN are formed to a thickness of 5 to 80 nm on the Ta films 231b to 235b forming the gate electrodes 231 to 234 and the capacitor line 235. Furthermore, in the case where the conductive layers (B) 231b to 235b are made of tungsten (W), tungsten nitride (WN) layers are formed thereon. In the case where the conductive layers (B) 231b to 235b are made of titanium (Ti), titanium nitride (TiN) are formed thereon. Furthermore, even when the gate electrodes 231 to 234 are exposed to a nitrogen-containing plasma atmosphere using nitrogen, ammonia, or the like, similar layers can be formed thereon. Then, thermal annealing is conducted at 300° C. to 450° C. for 1 to 12 hours in an atmosphere containing 3 to 100% hydrogen to hydrogenate the island-like semiconductor film. In this step, a dangling bond of $10^{16}$ to $10^{18}$/cm$^3$ in the island-like semiconductor film is terminated by thermally excited hydrogen. As another means for hydrogenation, plasma hydrogenation (using hydrogen excited by plasma) may be conducted.

Figure 11D:
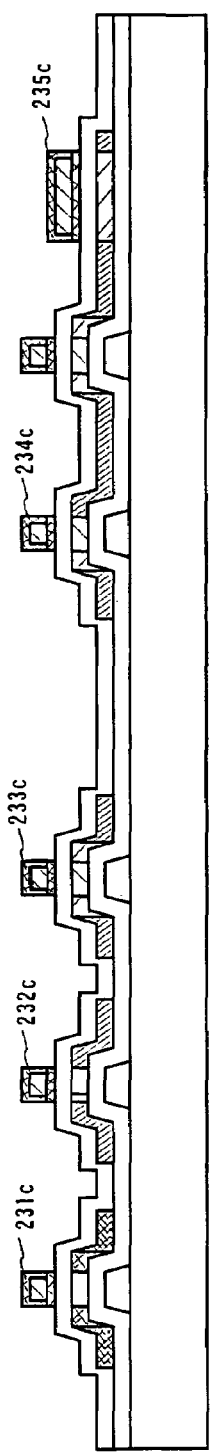

If a catalytic element promoting crystallization of silicon is used in the crystallization step, and thereafter, a gettering step explained in Embodiment Mode 2 is not conducted, a trace amount (about $1 \times 10^{17}$ to about $1 \times 10^{19}$ atoms/cm$^3$) of catalytic element remains in the island-like semiconductor film. Needless to say, TFTs can be completed even in such a state; however, it is more preferable to remove the remaining catalytic element at least from a channel formation region. One of methods for removing the catalytic element is to utilize a gettering function of phosphorus (P). The concentration of phosphorus (P) required for gettering may be the same as that of the impurity region (n$^+$) formed in FIG. 11B. Due to thermal annealing in the activation step implemented hererin, the catalytic element can be segregated from the channel formation regions of an n-channel TFT and a p-channel TFT to the impurity regions 242 to 246. As a result, the catalytic element in a concentration of about $1 \times 10^{17}$ to about $1 \times 10^{19}$ atoms/cm$^3$ can be segregated to the impurity regions 242 to 246 (FIG. 11D).

After activation and hydrogenation steps are finished, a second conductive layer for forming a gate line is formed. The second conductive layer is formed of a conductive layer (D) mainly containing aluminum (Al), copper (Cu), or the like that are low-resistant materials. In any case, the resistance of the second conductive layer is prescribed to be about 0.1 to about 10 μΩcm. Furthermore, a conductive layer (E) formed of titanium (Ti), tantalum (Ta), tungsten (W), molybdenum (Mo) or the like is preferably formed. In this embodiment, the conductive layer (D) 249 is formed of an aluminum (Al) film containing 0.1 to 2% by weight of titanium (Ti), and the conductive layer (E) 250 is formed of a titanium (Ti) film. The conductive layer (D) 249 is preferably formed to a thickness of 200 to 400 nm (preferably 250 to 350 nm), and the conductive layer (E) 250 is preferably formed to a thickness of 50 to 200 nm (preferably, 100 to 150 nm) (FIG. 12A).

Then, the conductive layer (E) 250 and the conductive layer (D) 249 are etched for forming gate lines connected to the gate electrodes, thereby gate lines 251 and 252, and a capacitor line 253 are formed. Etching is first conducted by dry etching using a mixed gas of SiCl$_4$ and BCl$_3$, in which the conductive layer (D) is removed from the surface of the conductive layer (E), whereby gate lines can be formed, keeping selective processability with respect to the base film (FIG. 12B).

A first interlayer insulating film 254 is formed of a silicon oxide film or a silicon oxide nitride film with a thickness of 500 to 1500 nm. In this embodiment, the film is formed under the conditions of 27 SCCM of SiH$_4$, 900 SCCM of N$_2$O, a reactive pressure of 160 Pa, a substrate temperature of 325° C., and a discharge power density of 0.15 W/cm$^2$. Thereafter, contact holes are formed so as to reach the source regions or the drain regions formed on the respective island-like semiconductor films, and source lines 255 to 258 and drain lines 259 to 262 are formed. Although not shown, in this embodiment, this electrode is formed as a three-layered structure in which a Ti film (100 nm), an aluminum film (300 nm) containing Ti, and a Ti film (150 nm) are continuously formed by sputtering.

Next, a silicon nitride film, a silicon oxide film, or a silicon oxide nitride film is formed to a thickness of 50 to 500 nm (typically 100 to 300 nm) as a passivation film 263. If hydrogenation is conducted in this state, preferable results for enhancement of TFT characteristics are obtained. For example, heat treatment may be conducted at 300° C. to 450° C. for 1 to 12 hours in an atmosphere containing 3 to 100% hydrogen. Alternatively, similar results can be obtained even by using plasma hydrogenation. Furthermore, hydrogen present in the first interlayer insulating film 254 is diffused to the island-like semiconductor films 209 to 212 by such heat treatment, whereby hydrogenation can be conducted. In any case, it is desirable to prescribe the defect density of the island-like semiconductor films 209 to 212 to be $10^{16}$/cm$^3$ or less. For this purpose, hydrogen should be added in an amount of about 0.01 to 0.1 atomic % (FIG. 12C). Herein, an opening may be formed in the passivation film 263 at a position where a contact hole is formed for connecting a pixel electrode to a drain line later.

Figure 13:
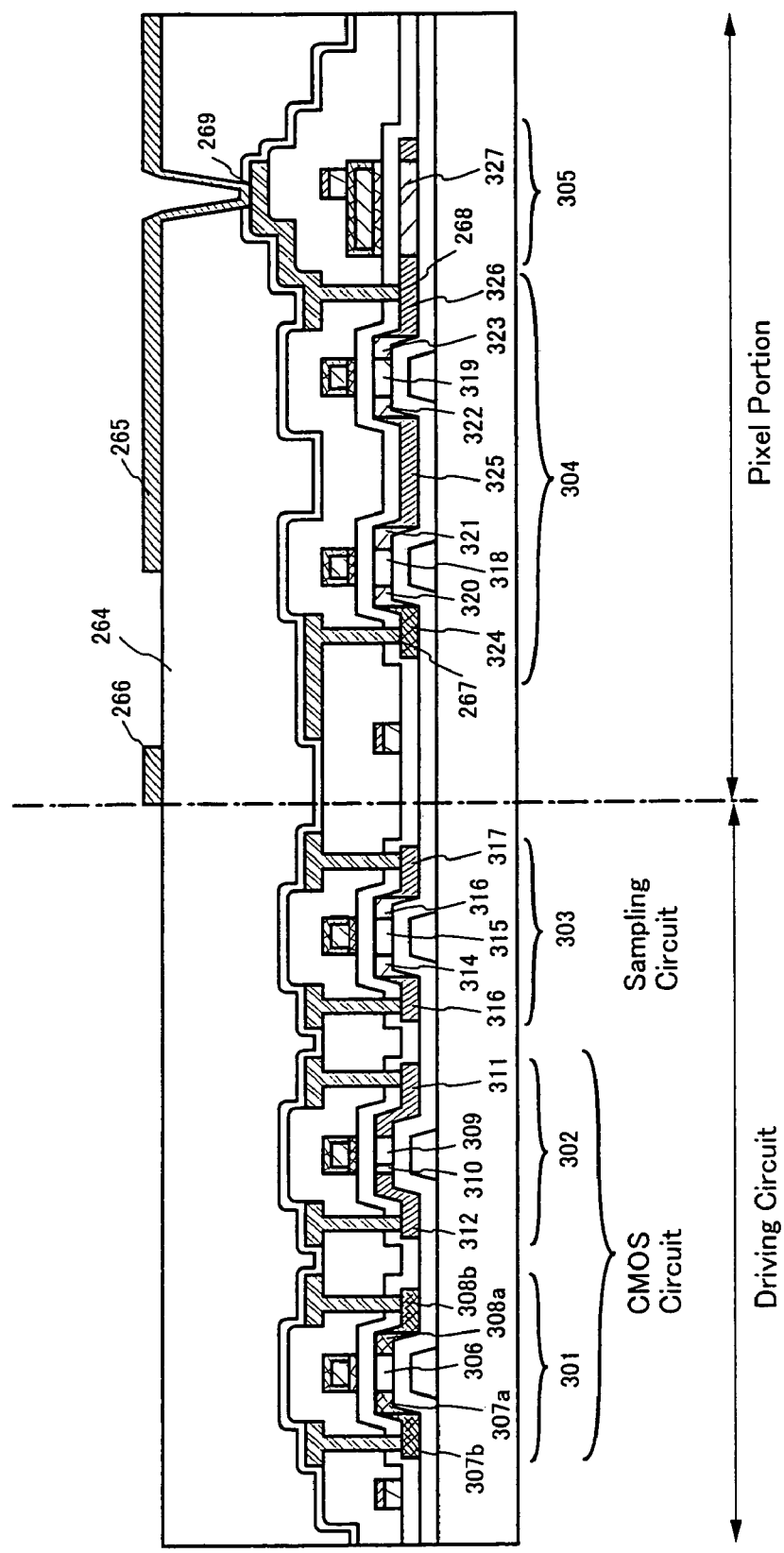
FIG. 13 is a diagram showing the process of manufacturing the TFTs for the pixel portion and the driver circuit portion.

Thereafter, as shown in FIG. 13, a second interlayer insulating film 264 made of organic resin is formed to a thickness of 1.0 to 1.5 μm. Examples of the organic resin include polyimide, acrylic resin, polyamide, polyimideamide, and BCB (benzocyclobutene). Herein, polyimide that is thermally polymerized after being applied to a substrate is used. The polyimide is baked to 300° C. to form the second interlayer insulating film 264. Then, a contact hole is formed in the second interlayer insulating film 264 so as to reach the drain line 262, and pixel electrodes 265 and 266 are formed. As the pixel electrodes, a transparent conductive film may be used in the case of manufacturing a transmission type liquid crystal display device. In the case of manufacturing a reflection type liquid crystal display device, a metal film may be used. In this embodiment, in order to produce a transmission type liquid crystal display device, a transparent conductive film selected from the group consisting of an indium tin oxide (ITO) film, a zinc oxide (ZnO) film, and an indium oxide/tin/zinc oxide film is formed to a thickness of 100 nm by sputtering.

Thus, TFTs for a driver circuit and a pixel TFT for a pixel portion can be formed on the same substrate. In the driver circuit, a p-channel TFT 301, a first n-channel TFT 302, and a second n-channel TFT 303 are formed, and in the pixel portion, a pixel TFT 304 and a storage capacitor 305 are formed. In this specification, such a substrate will be referred to as an active matrix substrate for convenience.

The p-channel TFT 301 in the driver circuit includes a channel formation region 306, source regions 307a and 307b, and drain regions 308a and 308b in the island-like semiconductor film 209. The first n-channel TFT 302 includes a channel formation region 309, an LDD region ($L_{OV}$)310 overlapping the gate electrode 233, a source region 311, and a drain region 312 in the island-like semiconductor film 210. The length of the LDD region ($L_{OV}$) in the channel length direction is 0.5 to 3.0 µm, preferably 1.0 to 1.5 µm. The second n-channel TFT 303 includes a channel formation region 313, $L_{OV}$, region and $L_{off}$ region (LDD region that does not overlap the gate electrode; hereinafter, referred to as an $L_{off}$ region) in the island-like semiconductor film 211. The length of the $L_{off}$ region in the channel length direction is 0.3 to 2.0 µm, preferably 0.5 to 1.5 µm. The pixel TFT 304 includes channel formation regions 318 and 319, $L_{off}$ regions 320 to 323, and source or drain regions 324 to 326 in the island-like semiconductor film 212. The length of the $L_{off}$ region in the channel length direction is 0.5 to 3.0 µm, preferably 1.5 to 2.5 µm. Furthermore, the storage capacitor 305 is composed of capacitor line 253, an insulating film made of the same material as that of the gate insulating film, and a semiconductor layer 327 which is connected to the drain region 326 of the pixel TFT 304 and to which an n-type impurity element is added. In FIG. 13, the pixel TFT 304 has a double gate structure; however, it may have a single gate structure or a multi-gate structure in which a plurality of gate electrodes are provided.

Because of the above, it is possible that the structure of a TFT forming each circuit is optimized in accordance with the specification required by a pixel TFT or a driver circuit are optimized, and the operation performance and reliability of a semiconductor device can be enhanced. Furthermore, the gate electrodes are formed of a conductive material having heat resistance, whereby an LDD region, a source region, and a drain region can be easily activated. Furthermore, the gate lines are made of a low resistant material, whereby the resistance thereof can be sufficiently lowered. Thus, the present invention can be applied to a display device with a display region (a screen size) of 4 inches or more. Furthermore, by using a crystalline silicon film having a single crystal structure selectively formed on the island-like insulating films 202 to 206 to form a base film, fine TFTs can be manufactured.

Embodiment 2

Figure 14:
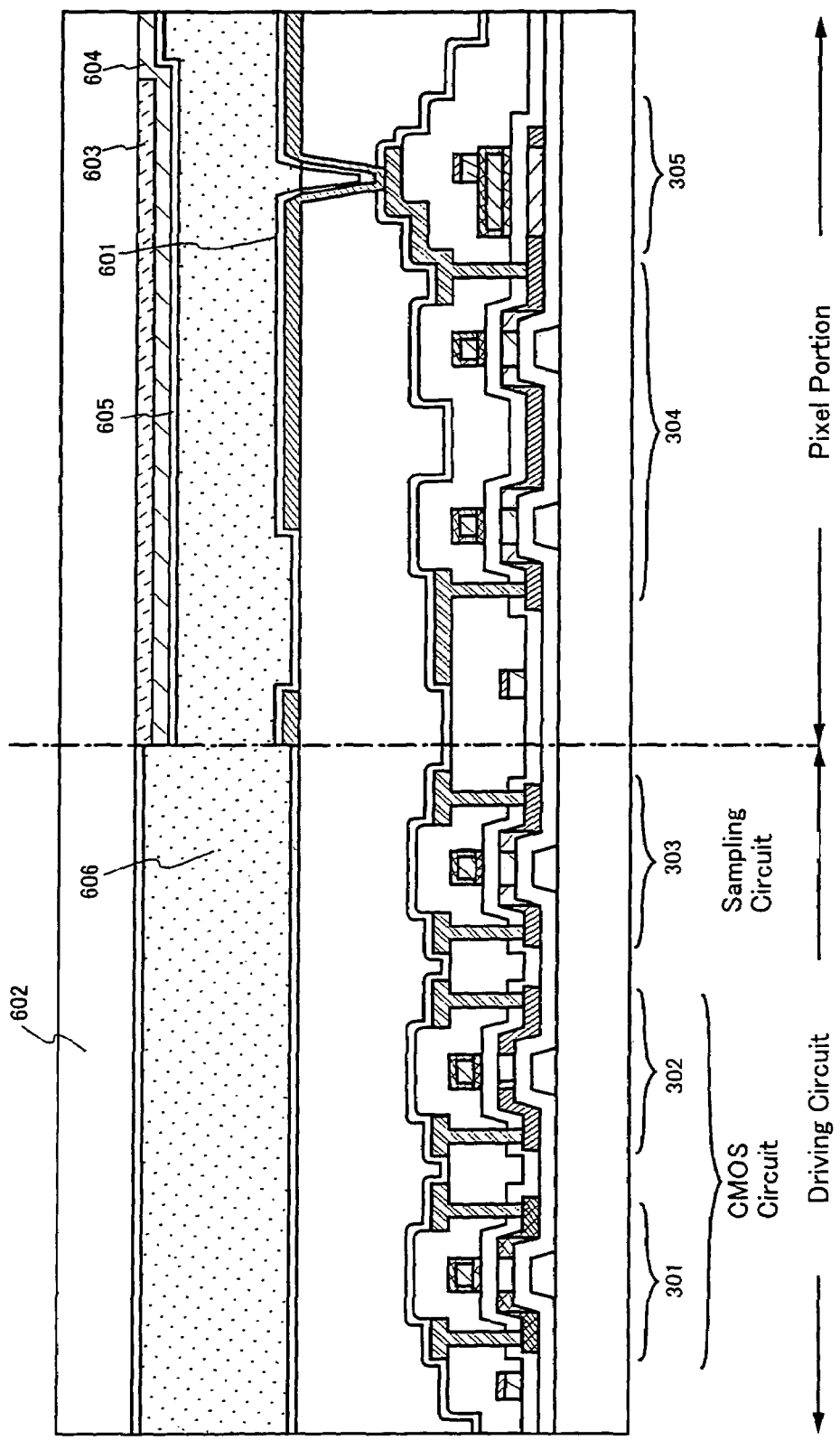
FIG. 14 is a diagram showing the structure of a liquid crystal display device.

In Embodiment 2, a process of manufacturing an active matrix liquid crystal display device by using the active matrix substrate of Embodiment 1 is explained. An alignment film is formed for the active matrix substrate in the state of FIG. 13 in Embodiment 1. A polyimide resin is often used for the alignment film of a liquid crystal display device. A light shielding film 603, a transparent conducting film 604, and an alignment film 605 are formed on an opposing substrate 602 of an opposing side. After forming the alignment films, a rubbing process is performed to give the liquid crystal molecules a certain fixed pre-tilt angle, bringing them into alignment. The active matrix substrate, on which the pixel portion and the CMOS circuit are formed, and the opposing substrate are then joined together by a sealing material or spacers (both not shown in the figures) in accordance with a known cell construction process. Thereafter, a liquid crystal material 606 is injected between both substrates, and the cell is completely sealed by a sealant (not shown in the figures). A known liquid crystal material may be used as the liquid crystal material. Thus the active matrix liquid crystal display device shown in FIG. 14 is completed.

Note that the active matrix liquid crystal display device of Embodiment 2 is explained in accordance with the structure explained in Embodiment 1, but it is not limited to the structure of Embodiment 1, and an active matrix substrate completed by applying the processes shown by Embodiment modes 1 to 3 to Embodiment 1 may also be used.

Embodiment 3

Figure 25A:
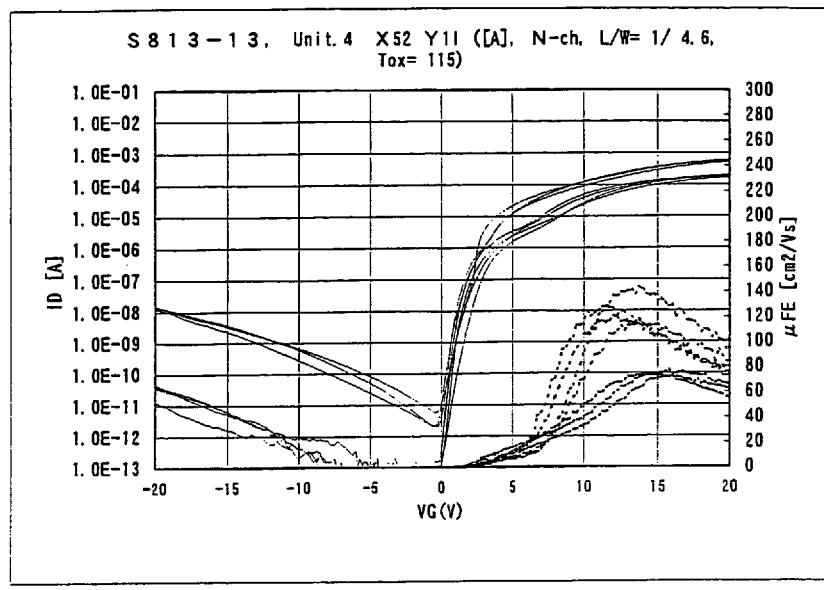
FIGS. 25A and 25B are graphs each showing characteristics of a TFT.
Figure 25B:
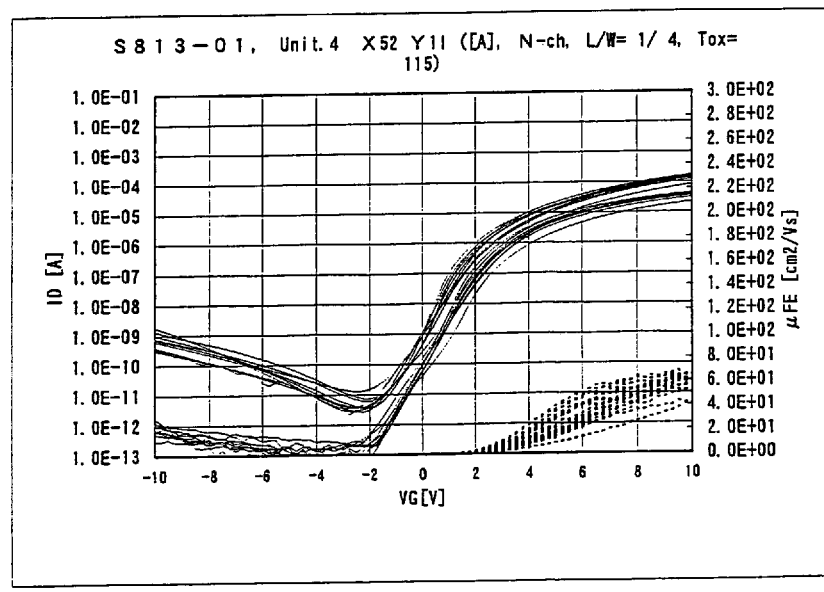
Figure 26:
FIG. 26 is a diagram showing the results of observation of crystallization by SEM.

In this embodiment, an N channel TFT is manufactured using a semiconductor film obtained by crystallizing an island-like insulating film as the one shown in the observation result of FIG. 26 by laser annealing. FIGS. 25A and 25B are graphs showing the relation between the drain current (ID) of the thus manufactured N channel TFT and the gate voltage (VG) thereof (hereinafter referred to as ID-VG curve), and showing the field effect mobility ($\mu_{FE}$). Here, the source voltage (VS) is set to 0 V, the drain voltage (VD) is set to 1 V or 5V. The measured value for the channel length (L) is 2 µm, and 4 µm for the channel width (W). In FIG. 25A, the thickness of the semiconductor film is 55 nm, and the level difference by the base insulating film is 50 nm. FIG. 25B is a graph showing, for the sake of comparison, the results of a similar measurement performed on an N channel TFT manufactured using a semiconductor film that is crystallized by laser annealing without using the level difference of the present invention.

An S value is the value indicating a reciprocal number of the maximum tilt in a rising part of the ID-VG curve. The S value of the N channel TFT manufactured in accordance with the present invention is 0.2 to 0.4 (V/decade) when VG=5 V. The field effect mobility ($\mu_{FE}$) is 120 to 140 (cm$^2$/V sec) when VG=1 V. These results obtained are excellent.

The descriptions above verify that the techniques of the present invention are capable of manufacturing a crystalline semiconductor film while controlling the position and the size of the crystal grain in the film.

Embodiment 4

In addition to a nematic liquid crystal, it is also possible to use various other liquid crystals in a liquid crystal display device of the above mentioned invention. For example, it is possible to use the liquid crystal disclosed in: H. Furue et al., "Characteristics and Driving Scheme of Polymer-stabilized Monostable FLCD Exhibiting Fast Response Time and High Contrast Ratio with Gray-scale Capability" SID, 1998; T. Yoshida et al., "A Full-color Thresholdless Antiferroelectric LCD Exhibiting Wide Viewing Angle with Fast Response Time" SID Digest, 841, 1997; J. Mater. Chem., 6 (4), pp. 671–3, 1996; S. Inui et al., "Thresholdless antiferroelectricity in liquid crystals and its application to displays", and U.S. Pat. No. 5,594,569.

Figure 15:
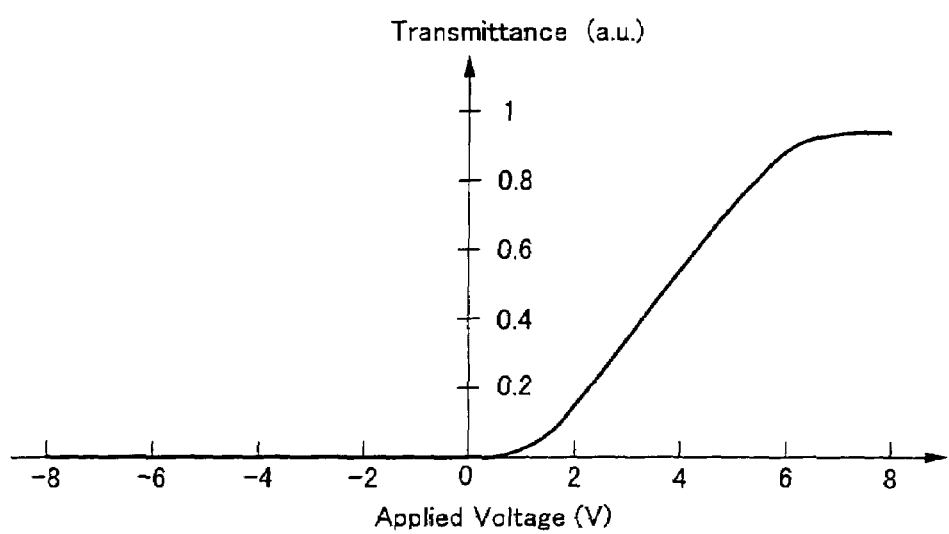
FIG. 15 is a graph showing an example of a light transmittance characteristics of an antiferroelectric mixed liquid crystal.

The electro-optical characteristics of a monostable ferroelectric liquid crystal (FLC), in which an FLC showing a phase transition system of an isotropic phase-cholesteric phase chiralsmectic C phase is used, and in which a phase transition is caused from the cholesteric phase to the chiralsmectic C phase, a cone edge being made to nearly conform with a rubbing direction while applying a DC voltage, are shown in FIG. 15. The display mode of a ferroelectric liquid crystal like that shown in FIG. 15 is referred to as a "half-V switching mode". The vertical axis of the graph shown in FIG. 15 is the transmittance (in arbitrary units), and the horizontal axis is the applied voltage. Details regarding the "half-V switching mode" may be found in: Terada et al, "Half-V Switching Mode FLCD", Proceedings of the 46th Japan Society of Applied Physics Lectures, March 1999, p. 1316; and in Yoshihara et al, "Time-Division Full Color LCD by Ferroelectric Liquid Crystal", Liquid Crystals, vol. 3, no. 3, p. 190.

As shown in FIG. 15, it is apparent that if this type of ferroelectric mixed liquid crystal is used, it becomes possible to have a low voltage drive and a gray scale display. A ferroelectric liquid crystal that shows these electro-optical characteristics can be used in the liquid crystal display device of the present invention.

In addition, a liquid crystal that exhibits an anti-ferroelectric phase in a certain temperature range is referred to as an anti-ferroelectric liquid crystal (AFLC). As mixed liquid crystals having an anti-ferroelectric liquid crystal, there are ones referred to as thresholdless antiferroelectric mixed liquid crystals, which show electro-optical response characteristics in which the transmittance continuously changes in response to the electric field. The thresholdless antiferroelectric mixed liquid crystal shows so-called V-type electro-optical response characteristics, and some have been found to have a drive voltage of approximately ±2.5 V (when the cell thickness is about 1 µm to 2 µm).

Further, in general the spontaneous polarization of a thresholdless antiferroelectric mixed liquid crystal is large, and the dielectric constant of the liquid crystal itself is high. It is thus necessary for a relatively large storage capacitor in pixel when a thresholdless antiferroelectric mixed liquid crystal is used for a liquid crystal display device. Therefore, it is preferable to use a thresholdless antiferroelectric mixed liquid crystal that has a small spontaneous polarization.

Note that a low drive voltage can be realized by using this type of thresholdless antiferroelectric mixed liquid crystal in the liquid crystal display devices of the present invention, and therefore low power consumption can also be realized.

Embodiment 5

CMOS circuits and pixel portions formed by implementing the present invention can be used in various electro-optical devices (such as an active matrix liquid crystal display device, active matrix EL display, active matrix EC display, and the like). Namely, the present invention can be implemented in all electronic apparatus in which these electro-optical devices are built into a display portion.

The following can be given as such electronic apparatus: a video camera, a digital camera, a projector (rear type or front type), a head-mounted display (a goggle type display), a personal computer, and a portable information terminal (such as a mobile computer, a portable telephone or an electronic book). Examples of these are shown in FIGS. 16, 17 and 18.

Figure 16A:
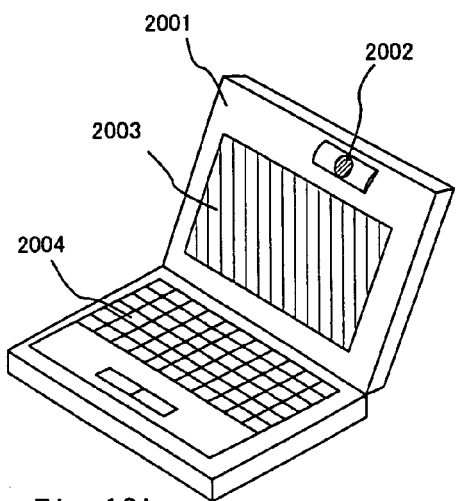
FIGS. 16A to 16F are diagrams showing examples of a semiconductor device.

FIG. 16A is a personal computer, and it includes a main body 2001, an image input portion 2002, a display portion 2003, and a keyboard 2004, etc. The present invention can be applied to the image input portion 2002, the display portion 2003 or other signal controlling circuits.

Figure 16B:
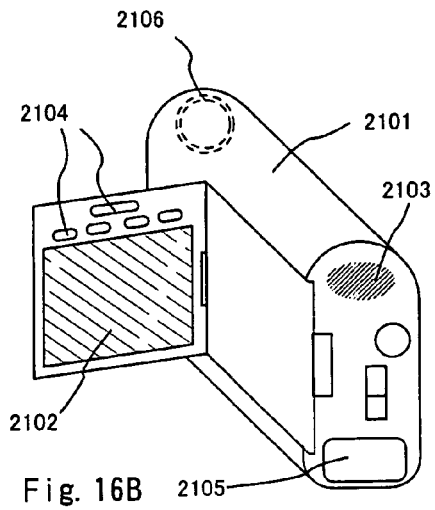

FIG. 16B is a video camera, and it includes a main body 2101, a display portion 2102, an audio input portion 2103, operation switches 2104, a battery 2105, and an image receiving portion 2106, etc. The present invention can be applied to the display portion 2102 or other signal controlling circuits.

Figure 16C:
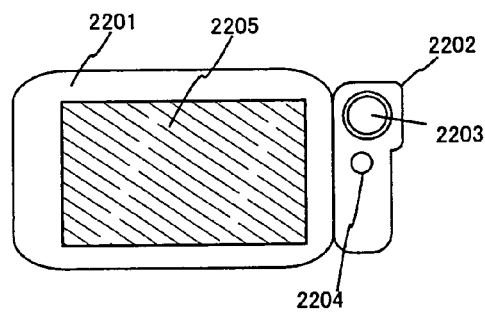

FIG. 16C is a mobile computer, and it includes a main body 2201, a camera portion 2202, an image receiving portion 2203, operation switches 2204, and a display portion 2205. The present invention can be applied to the display portion 2205 or other signal controlling circuits.

Figure 16D:
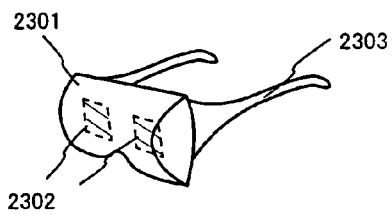

FIG. 16D is a goggle type display, and it includes a main body 2301, a display portion 2302, an arm portion 2303, etc. The present invention can be applied to the display portion 2302 or other signal controlling circuits.

Figure 16E:
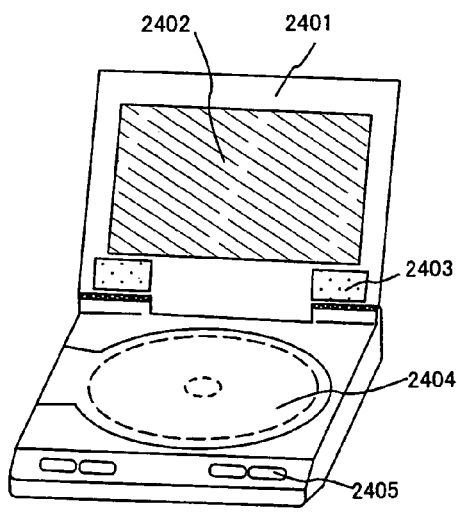

FIG. 16E is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402 or other signal controlling circuits.

Figure 16F:
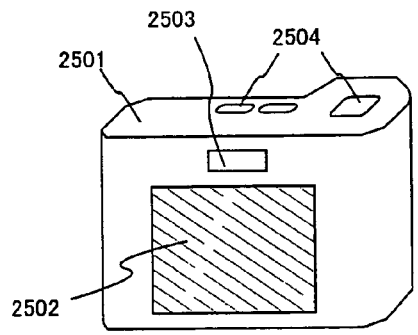

FIG. 16F is a digital camera, and it includes a main body 2501, a display portion 2502, an eyepiece portion 2503, operation switches 2504, and an image receiving portion (not shown in the figure), etc. The present invention can be applied to the display portion 2502 or other signal controlling circuits.

Figure 17A:
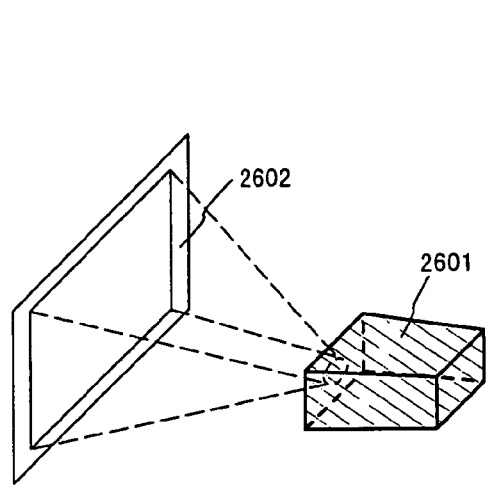
FIGS. 17A to 17D are diagrams showing examples of a semiconductor device.

FIG. 17A is a front type projector, and it includes a projection system 2601, a screen 2602, etc. The present invention can be applied to a liquid crystal display device 2808 which constitutes a part of the projection system 2601, or other signal controlling circuits.

Figure 17B:
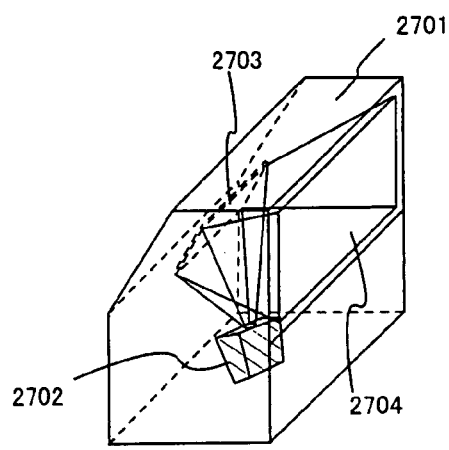

FIG. 17B is a rear type projector, and it includes a main body 2701, a projection system 2702, a mirror 2703, a screen 2704, etc. The present invention can be applied to a liquid crystal display device 2808 which constitutes a part of the projection system 2702 or other signal controlling circuits.

Figure 17C:
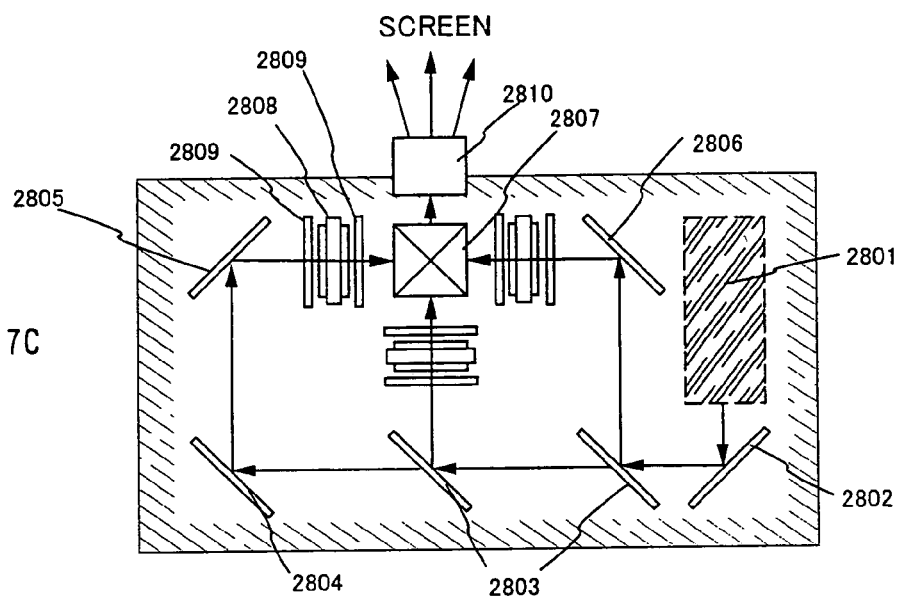

Note that FIG. 17C is a diagram showing an example of the structure of projection systems 2601 and 2702 of FIGS. 17A and 17B. The projection systems 2601 and 2702 comprise an optical light source system 2801, mirrors 2802 and 2804 to 2806, a dichroic mirror 2803, a prism 2807, a liquid crystal display device 2808, phase differentiating plate 2809 and a projection optical system 2810. The projection optical system 2810 comprises an optical system including a projection lens. The present Embodiment showed a three plate type, but it is not limited to this structure, and it may be for instance a single plate type. Further, the operator may appropriately dispose an optical system such as an optical lens, a film having light polarizing function, a film for adjusting phase difference and an IR film, in the optical path shown by an arrow in the FIG. 17C.

Figure 17D:
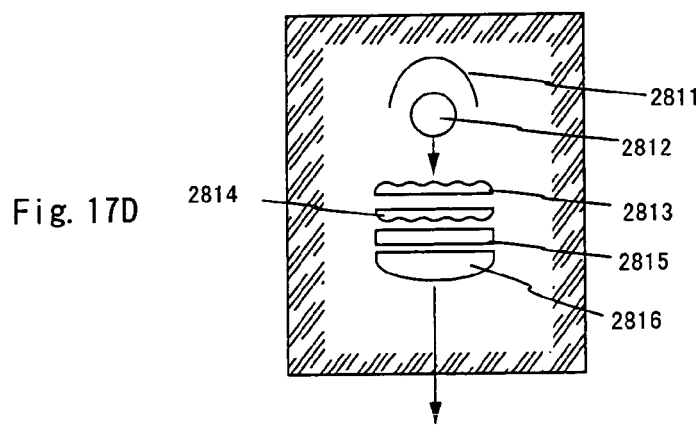

Further, FIG. 17D is a diagram showing an example of the structure of the optical light source system 2801 of FIG. 17C. In the present Embodiment, the optical light source system 2801 comprises a reflector 2811, a light source 2812, lens arrays 2813 and 2814, light polarizing conversion element 2815 and a condenser lens 2816. Note that the optical light source system shown in FIG. 17D is merely an example and is not specifically limited. For example, the operator may appropriately dispose an optical system such as an optical lens, a film having light polarizing function, a film for adjusting phase difference and an IR film, etc., in the optical light source system.

Provided however, the projectors shown in FIG. 17 show a case of using a transmission type electro-optical device and an application example of a reflection type electro-optical device is not shown in the figures.

Figure 18A:
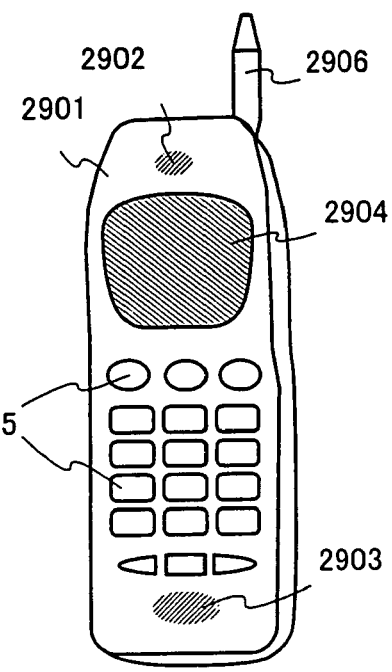
FIGS. 18A to 18C are diagrams showing examples of a semiconductor device.

FIG. 18A is a portable telephone, and it includes a main body 2901, an audio output portion 2902, an audio input portion 2903, a display portion 2904, operation switches 2905, and an antenna 2906, etc. The present invention can be applied to the audio output portion 2902, the audio input portion 2903, the display portion 2904 or other signal controlling circuits.

Figure 18B:
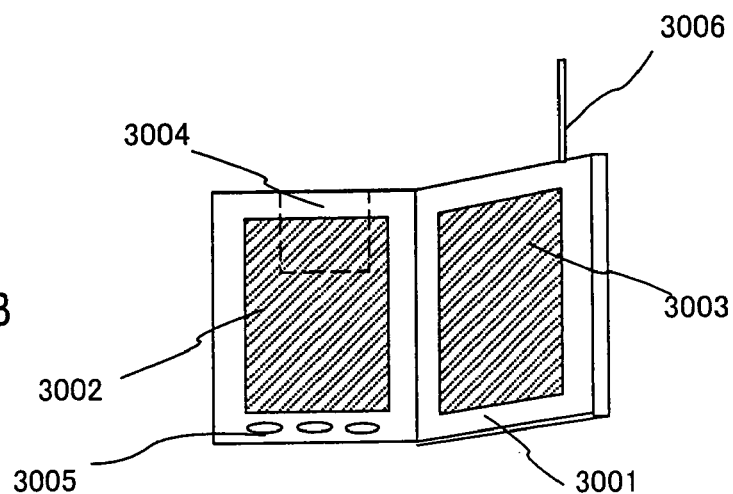

FIG. 18B is a portable book (electronic book), and it includes a main body 3001, display portions 3002 and 3003, a recording medium 3004, operation switches 3005, and an antenna 3006, etc. The present invention can be applied to the display portions 3002 and 3003 or other signal controlling circuits.

Figure 18C:
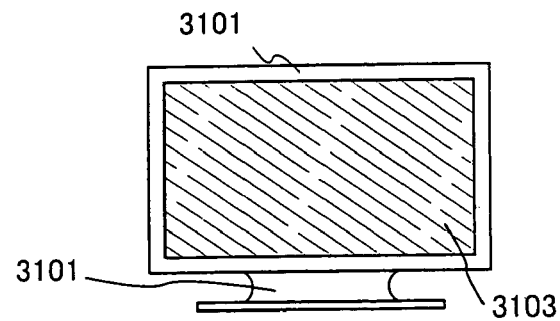

FIG. 18C is a display, and it includes a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic apparatus in all fields. Further, the electronic apparatus of this embodiment can be realized by using a constitution of any combination of Embodiment Modes 1 to 4, and Embodiments 1 to 3.

Embodiment 6

In this embodiment, the case will be described where an EL (electroluminescence) display device is formed using the present invention.

Figure 19A:
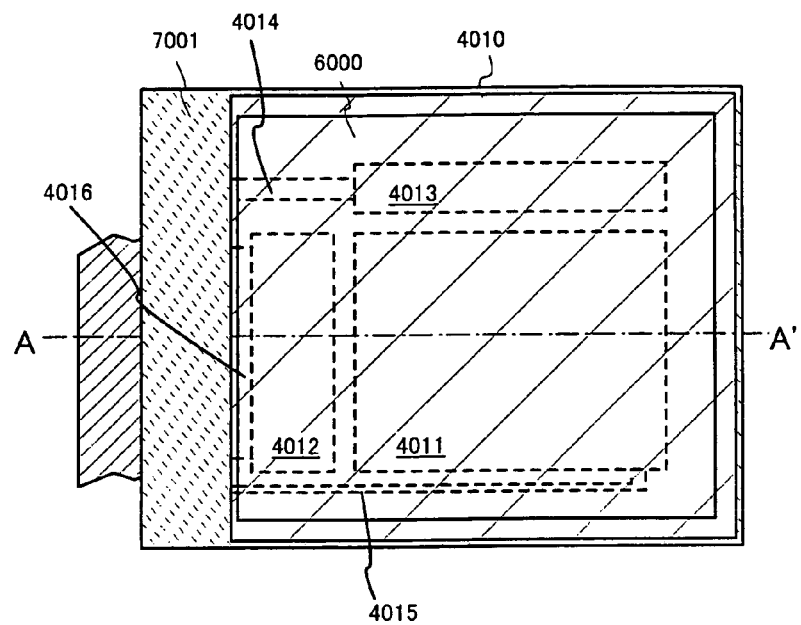
FIGS. 19A and 19B are diagrams showing the structure of an EL display device.

FIG. 19A is a top view of an EL display panel using the present invention. In FIG. 19A, reference numeral 4010 denotes a substrate, 4011 denotes a pixel portion, 4012 denotes a source-side driver circuit, and 4013 denotes a gate-side driver circuit. Each driver circuit is connected to an FPC 4017 through lines 4014 to 4016 so as to be connected to external equipment.

At this point, a covering material 6000, a sealing material (also referred to as a housing material) 7000, and an airtight sealing material (a second sealing material) 7001 are formed so as to enclose at least the pixel portion, preferably both the driver circuits and the pixel portion.

Figure 19B:
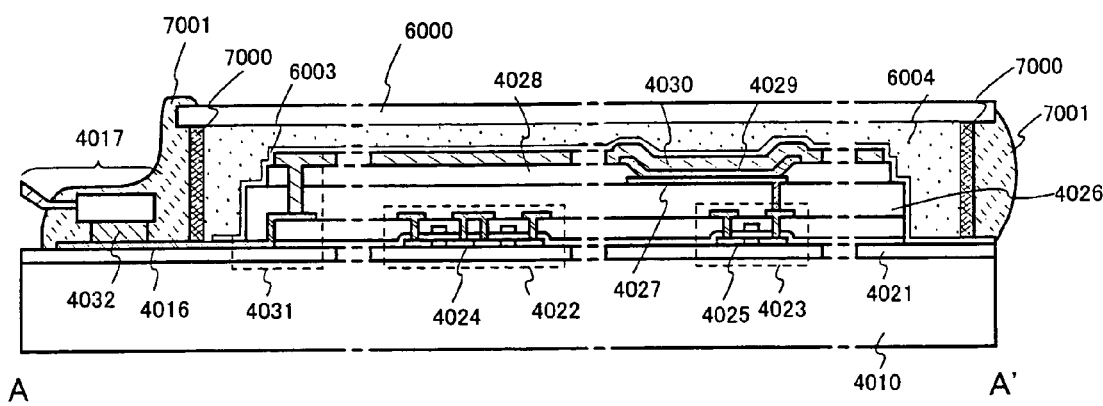

Furthermore, FIG. 19B is a cross-sectional view of the EL display panel in this embodiment. On the substrate 4010 and a base film 4021, a TFT 4022 for a driver circuit (herein, a CMOS circuit is shown, which is a combination of an n-channel TFT and a p-channel TFT) and a TFT 4023 for a pixel portion (herein, only a TFT for controlling a current to the EL element is shown) are formed.

The present invention can be used for the TFT 4022 for a driver circuit and the TFT 4023 for a pixel portion.

After completing the TFT 4022 for a driver circuit and the TFT 4023 for a pixel portion by using the present invention, a pixel electrode 4027 made of a transparent conductive film electrically connected to a drain of the TFT 4023 for a pixel portion is formed on an interlayer insulating film (flattening film) 4026 made of resin material. As the transparent conductive film, a compound (which is called as an ITO) of indium oxide and tin oxide or a compound of indium oxide and zinc oxide can be used. When the pixel electrode 4027 is formed, an insulating film 4028 is formed, and an opening is formed on the pixel electrode 4027.

Next, an EL layer 4029 is formed. The EL layer 4029 can have a layered structure including an appropriate combination of layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used on the other hand, in the case of using a polymer material, a simple method such as spin coating, printing, or an ink jet method can be used.

In this embodiment, the EL layer is formed by vapor deposition using a shadow mask. By forming light-emitting layers (red light-emitting layer, green-light emitting layer, and blue light-emitting layer) capable of emitting light with different wavelengths on the pixel basis, using a shadow mask, a color display can be performed. In addition, a combination of a color conversion layer (CCM) and a color filter, or a combination of a white light-emitting layer and a color filter may be used. Needless to say, an EL display device emitting single color light can also be used.

When the EL layer 4029 is formed, a cathode 4030 is formed thereon. It is desirable to remove moisture and oxygen present at an interface between the cathode 4030 and the EL layer 4029 as much as possible. Thus, it is required to continuously form the EL layer 4029 and the cathode 4030 in a vacuum, or to form the EL layer 4029 in an inactive atmosphere, and form the cathode 4030 without exposing the EL layer 4029 to the outside air. In this embodiment, for this purpose, a film formation device of a multi-chamber system (cluster tool system) is used.

In this embodiment, as the cathode 4030, a layered structure of a LiF (lithium fluoride) film and an Al (aluminum) film is used. More specifically, the LiF film is formed to a thickness of 1 nm on the EL layer 4029 by vapor deposition, and an Al film is formed to a thickness of 300 nm thereon. Also, a MgAg electrode that is a known cathode material may be used. The cathode 4030 is connected to the line 4016 in a region denoted by reference numeral 4031. The line 4016 is a power supply line for supplying a predetermined voltage to the cathode 4030, and is connected to the FPC 4017 via a conductive paste material 4032.

In order to electrically connect the cathode 4030 to the line 4016 in the region 4031, it is required to form contact holes in the interlayer insulating film 4026 and the insulating film 4028. The contact holes may be formed during etching of the interlayer insulating film 4026 (during formation of a contact hole for a pixel electrode) or during etching of the insulating film 4028 (during formation of an opening before forming the EL layer). Furthermore, when the insulating film 4028 is etched, the interlayer insulating film 4026 may also be etched together. In this case, if the interlayer insulating film 4026 and the insulating film 4028 are made of the same resin material, the shape of the contact holes can be made satisfactory.

A passivation film 6003, a filling material 6004, and the covering material 6000 are formed covering the surface of the EL element thus made.

In addition, the sealing material is formed between the covering material 6000 and the substrate 4010, so as to surround the EL element portion, and the airtight sealing material (the second sealing material) 7001 is formed on the outside of the sealing material 7000.

The filling material 6004 functions as an adhesive for bonding the covering material 6000 at this point. PVC (polyvinyl chloride), epoxy resin, silicon resin, PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

After spacers are provided, the passivation film 6003 can relieve the spacer pressure. Further, a film such as a resin film can be formed separately from the passivation film to relieve the spacer pressure.

Furthermore, a glass plate, an aluminum plate, a stainless steel plate, an FRP (Fiberglass-Reinforced Plastics) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens μm of aluminum foil is sandwiched by a PVF film or a Mylar film.

However, depending upon the light emission direction from the EL element (the light radiation direction), it is necessary for the covering material 6000 to have light transmitting characteristics.

Further, the line 4016 is electrically connected to the FPC 4017 through a gap between the airtight sealing material 7001 and the substrate 4010. Note that although an explanation of the line 4016 has been made here, the lines 4014 and 4015 are also electrically connected to the FPC 4017 by similarly passing underneath and the sealing material 7000 and the airtight sealing material 7001.

Embodiment 7

In this embodiment, an example of manufacturing an EL display device having a structure which differs from that of Embodiment 6. Parts having the same reference numerals as those of FIGS. 19A and 19B indicate the same portions, and therefore an explanation of those parts is omitted.

Figure 20A:
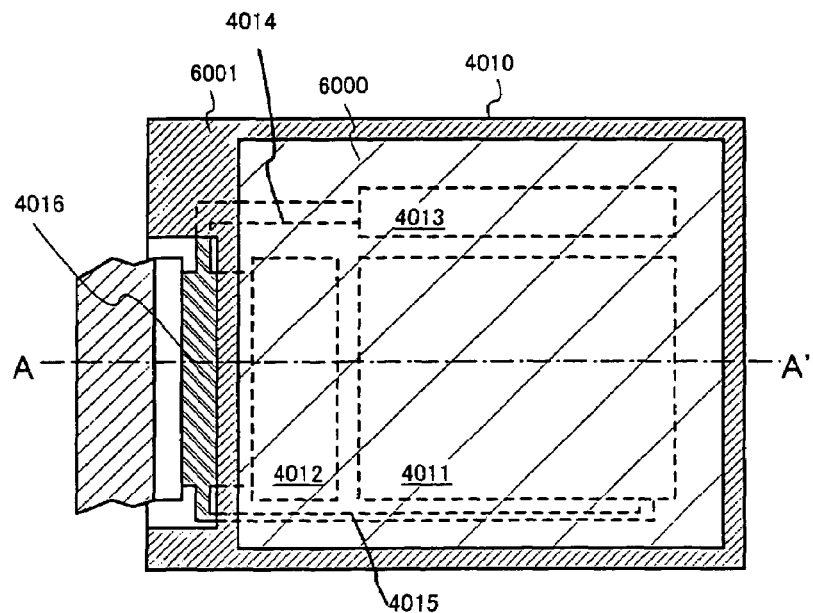
FIGS. 20A and 20B are diagrams showing the structure of another EL display device.
Figure 20B:
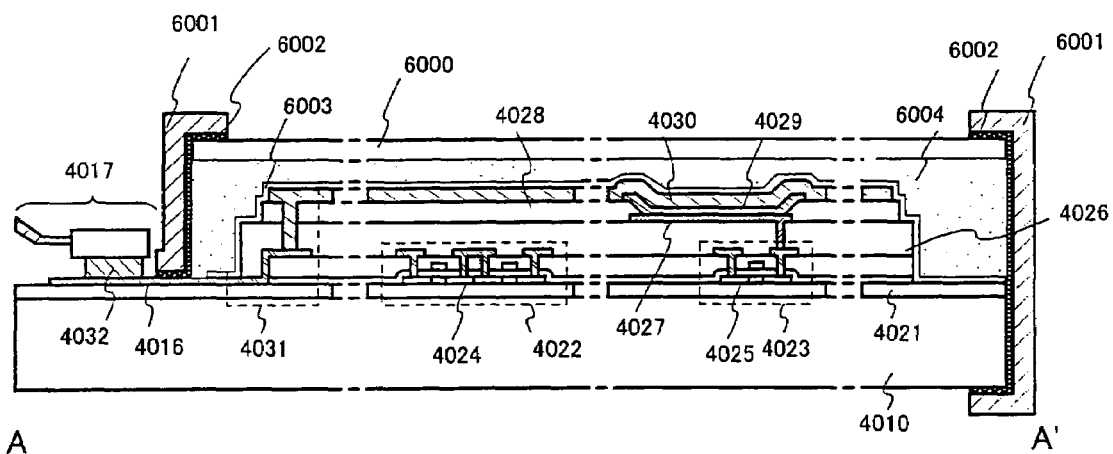

FIG. 20A is a top view of an EL display device of embodiment 7, and FIG. 20B shows a cross sectional diagram in which FIG. 20A is cut along the line A–A'.

In accordance with Embodiment 6, manufacturing is performed through the step of forming the passivation film 6003 covering the surface of the EL element.

In addition, the filling material 6004 is formed so as to cover the EL element. The filling material 6004 also functions as an adhesive for bonding the covering material 6000. PVC (polyvinyl chloride), epoxy resin, silicone resin, PVB (polyvinyl butyral), and EVA (ethylene vinyl acetate) can be used as the filling material 6004. If a drying agent is provided on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When spacers are provided, the passivation film 6003 can relieve the spacer pressure. Further, a film such as a resin film can be formed separately from the passivation film to relieve the spacer pressure.

Furthermore, a glass plate, an aluminum plate, a stainless steel plate, an FRP (fiberglass-reinforced plastics) plate, a PVF (polyvinyl fluoride) film, a Mylar film, a polyester film, and an acrylic film can be used as the covering material 6000. Note that if PVB or EVA is used as the filler material 6004, it is preferable to use a sheet with a structure in which several tens of μm of aluminum foil is sandwiched by a PVF film or a Mylar film.

However, depending upon the light emission direction from the EL element (the light radiation direction), it is necessary for the covering material 6000 to have light transmitting characteristics.

After bonding the covering material 6000 using the filling material 6004, the frame material 6001 is attached so as to cover the lateral surfaces (exposed surfaces) of the filling material 6004. The frame material 6001 is bonded by the sealing material (which functions as an adhesive) 6002. It is preferable to use a light hardening resin as the sealing material 6002 at this point, but provided that the heat resistance characteristics of the EL layer permit, a thermal hardening resin may also be used. Note that it is preferable that the sealing material 6002 be a material which, as much as possible, does not transmit moisture and oxygen. Further, a drying agent may also be added to an inside portion of the sealing material 6002.

The line 4016 is electrically connected to the FPC 4017 through a gap between the sealing material 6002 and the substrate 4010. Note that although an explanation of the line 4016 has been made here, the lines 4014 and 4015 are also electrically connected to the FPC 4017 by similarly passing underneath the sealing material 6002.

Embodiment 8

Figure 21:
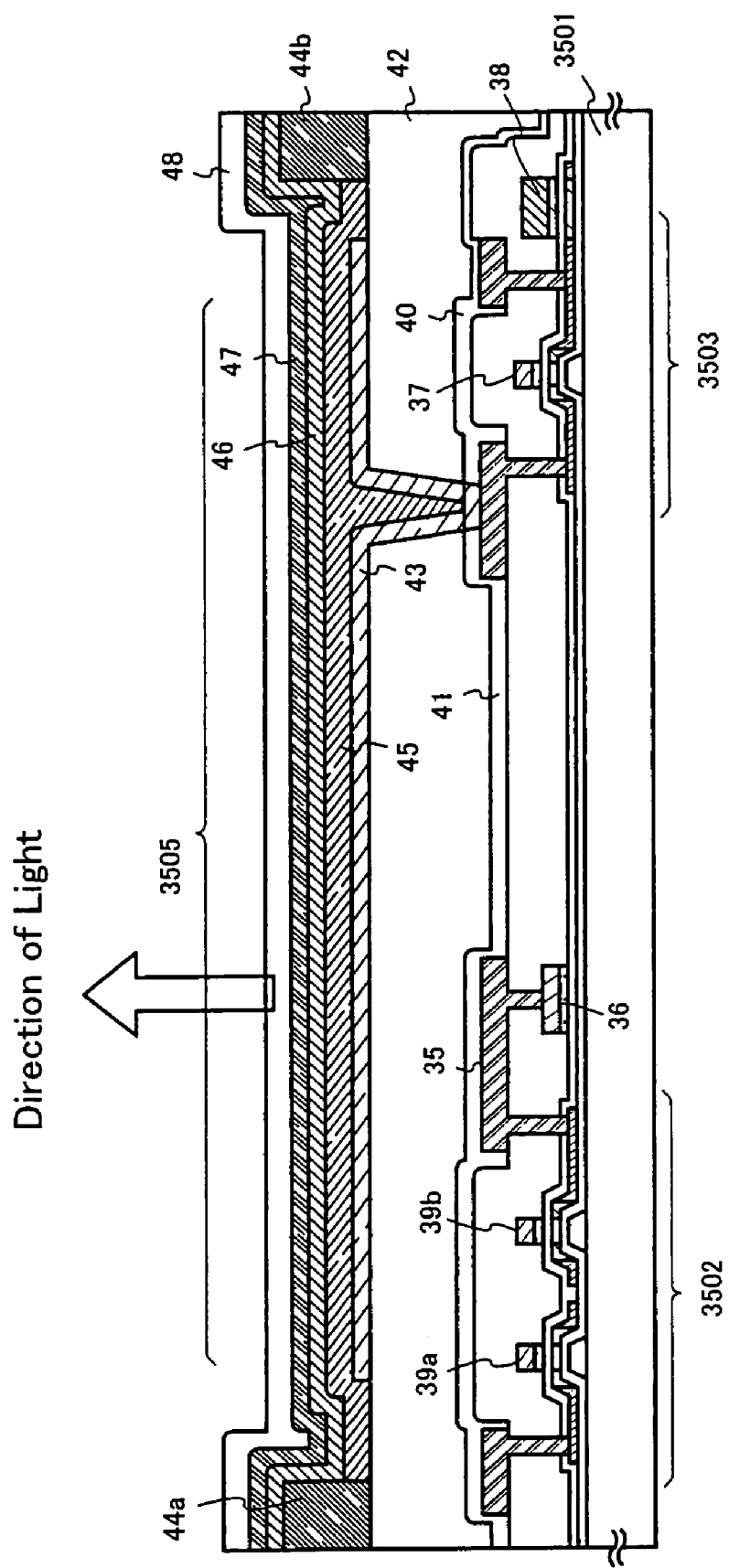
FIG. 21A is a diagram showing the structure of the EL display device of FIGS. 20A and 20B.
Figure 22A:
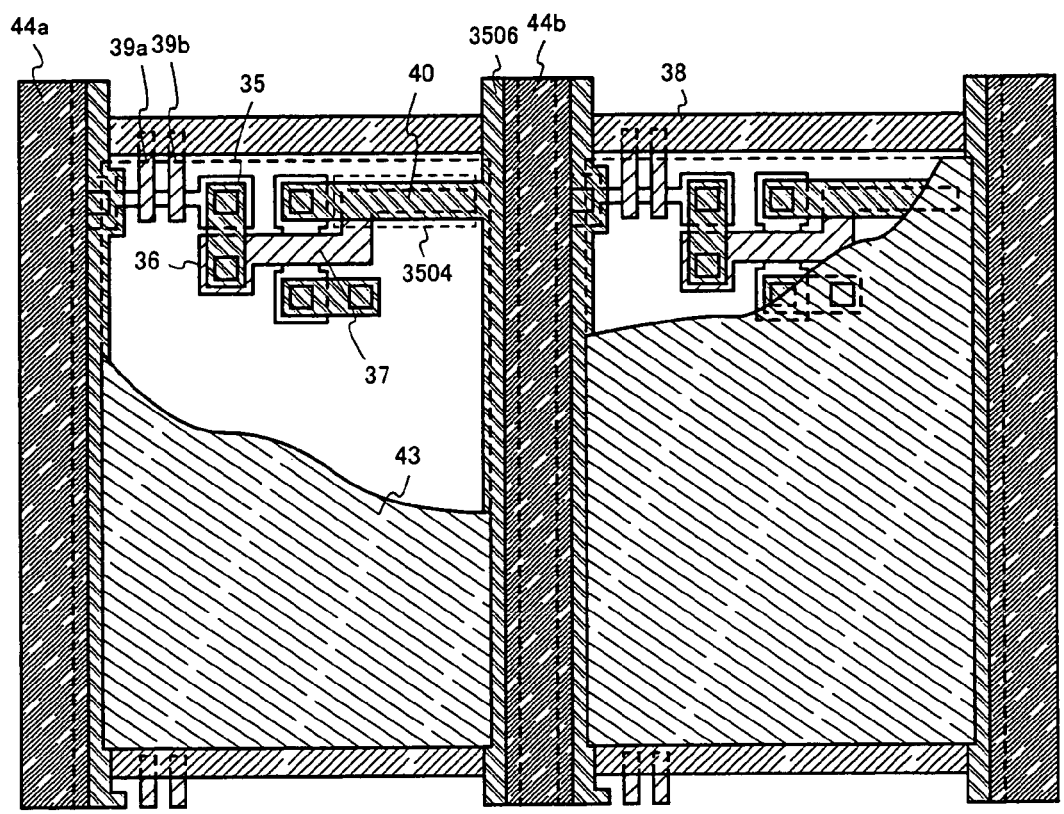
FIGS. 22A and 22B are diagrams showing the structure of the EL display device of FIGS. 20A and 20B.
Figure 22B:
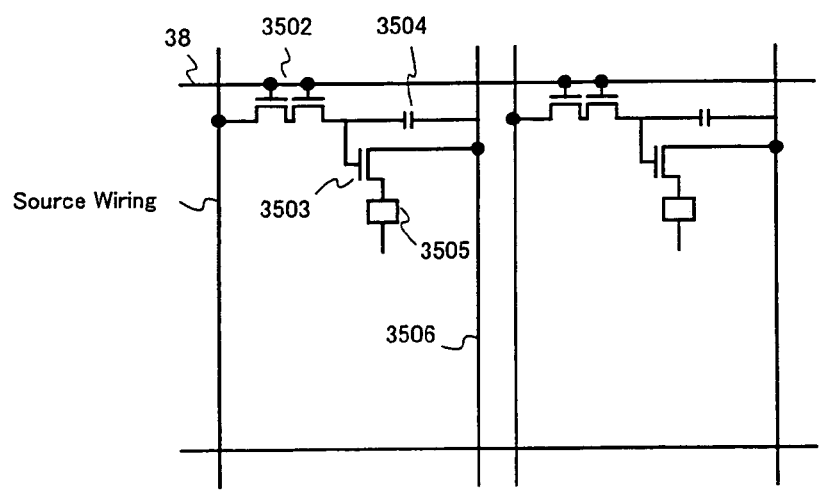

A more detailed cross sectional structure of a pixel portion in the EL display panel is shown here in FIG. 21. FIG. 22A shows a top structure and FIG. 22B shows a circuit diagram. In FIG. 21, FIGS. 22A and 22B, common reference numerals are used, it may be referred to each other.

In FIG. 21, a TFT 3502 for switching provided on a substrate 3501 is formed by using the n-channel TFT according to the present invention. (see Embodiment Modes 1 to 3 and embodiments 1 to 2) Due to the double-gate structure, there is an advantage in that substantially two TFTs are connected in series to reduce an OFF current value. It may have a double gate structure, a single gate structure, a triple gate structure, or a multi-gate structure having more gates.

A TFT 3503 for controlling a current is formed by using the NTFT according to the present invention. A drain line 35 of the switching TFT 3502 is electrically connected to a gate electrode 37 of the TFT for controlling a current via a line 36. Furthermore, a line 38 is a gate line electrically connected to gate electrodes 39a and 39b of the switching TFT 3502.

At this time, it is very important that the TFT 3503 for controlling a current has a structure according to the present invention. The TFT for controlling a current functions for controlling the amount of a current flowing through an EL element, so that the TFT is likely to be degraded by heat and hot carriers due to a large amount of current flown therethrough. Therefore, the structure of the present invention is very effective, in which an LDD region is provided in the drain side of the TFT for controlling a current so as to overlap the gate electrode via the gate insulating film.

Furthermore, in this embodiment, the TFT 3503 for controlling a current has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 22A, a line to be the gate electrode 37 of the TFT 3503 for controlling a current overlaps a drain line 40 of the TFT 3503 via an insulating film in a region 3504. In the region 3504, a capacitor is formed. The capacitor 3504 functions for holding a voltage applied to a gate of the TFT 3503. The drain line 40 is connected to a current supply line (power source line) 3506 so as to be always supplied with a constant voltage.

A first passivation film 41 is provided on the switching TFT 3502 and the TFT 3503 for controlling a current, and a flattening film 42 that is made of a resin insulating film is formed thereon. It is very important to flatten the level difference due to TFTs by using the flattening film 42. The level difference may cause a light-emitting defect because the EL layer to be formed later is very thin. Thus, it is desirable to flatten the level difference before forming a pixel electrode, so that the EL layer is formed on a flat surface.

Further, reference numeral 43 denotes a pixel electrode (cathode of an EL element) that is made of a conductive film with high reflectivity and is electrically connected to the drain of the TFT 3503 for controlling a current. As the pixel electrode 43, a low resistant conductive film such as an aluminum alloy film, a copper alloy film, and a silver alloy film, or a layered structure thereof can be preferably used. Needless to say, a layered structure with other conductive films may also be used.

A light-emitting layer 45 is formed in a groove (corresponding to a pixel) formed by banks 44a and 44b made of an insulating film (preferably resin). Herein, only one pixel is shown; however, light-emitting layers corresponding to each color R (red), G (green), and B (blue) may be formed. As an organic EL material for the light-emitting layer, a π-conjugate polymer material is used. Examples of typical polymer material include polyparaphenylene vinylene (PPV), polyvinyl carbazole (PVK), and polyfluorene.

There are various types of PPV organic EL materials. For example, materials as described in H. Shenk, Becker, O. Gelsen, E. Kluge, W. Kreuder and H. Spreitzer, "Polymers for Light Emitting Diodes", Euro Display, Proceedings, 1999, pp. 33–37, and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm).

The above-mentioned organic EL materials are merely examples for use as a light-emitting layer. The present invention is not limited thereto. A light-emitting layer, a charge-transporting layer, or a charge injection layer may be appropriately combined to form an EL layer (for light emitting and moving carriers therefor).

For example, in this embodiment, the case where a polymer material is used for the light-emitting layer has been described. However, a low molecular-weight organic EL material may be used. Furthermore, an inorganic material such as silicon carbide can also be used for a charge-transporting layer and a charge injection layer. As these organic EL materials and inorganic materials, known materials can be used.

In this embodiment, an EL layer with a layered structure is used, in which a hole injection layer 46 made of PEDOT (polythiophene) or PAni (polyaniline) is provided on the light-emitting layer 45, and an anode 47 made of a transparent conductive film is provided on the hole injection layer 46. In this embodiment, light generated by the light-emitting layer 45 is irradiated toward the upper surface (toward upper portion of a TFT), so that the anode 47 must be transparent to light. As a transparent conductive film, a compound of indium oxide and tin oxide, or a compound of indium oxide and zinc oxide can be used. The transparent conductive film is formed after forming the light-emitting layer and the hole injection layer with low heat resistance, so that the transparent conductive film that can be formed at a possibly low temperature is preferably used.

When the anode 47 is formed, the EL element 3505 is completed. The EL element 3505 refers to a capacitor composed of the pixel electrode (cathode) 43, the light-emitting layer 45, the hole injection layer 46, and the anode 47. As show in FIG. 22A, the pixel electrode 43 substantially corresponds to the entire area of a pixel. Therefore, the entire pixel functions as an EL element. Thus, a light image display with very high light use efficiency can be performed.

In this embodiment, a second passivation film 48 is further formed on the anode 47. As the second passivation film 48, a silicon nitride film or a silicon nitride oxide film is preferably used. The purpose of the passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display panel of the present invention has a pixel portion made of a pixel with a structure as shown in FIG. 21, and includes a TFT for switching having a sufficiently low OFF current value and a TFT for controlling a current that is strong to the injection of hot carriers. Thus, an EL display panel is obtained, which has high reliability and is capable of displaying a satisfactory image.

This embodiment can be realized by being appropriately combined with Embodiment Modes 1 to 3 and Embodiments 1 to 4. Furthermore, it is effective to use the EL display panel of this embodiment as a display portion of electronic apparatus of Embodiment 4.

Embodiment 9

In this embodiment, the case will be described where the structure of the EL element 3505 is reversed in the pixel portion described in Embodiment 8 with reference to FIG. 23. The difference from the structure shown in FIG. 21 lies only in the EL element and the TFT for controlling a current, so that the description of the other parts will be omitted.

Figure 23:
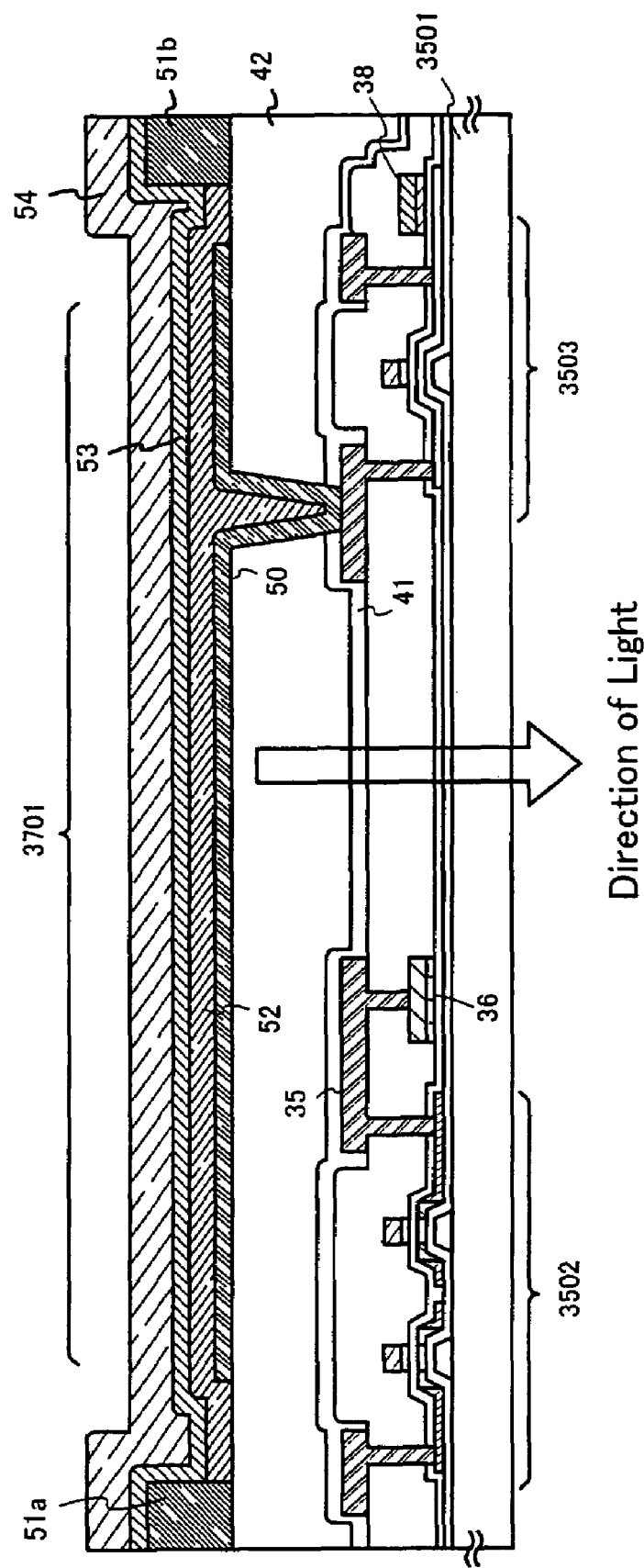
FIG. 23 is a diagram showing the structure of still another EL display device.

In FIG. 23, a TFT 3503 for controlling a current is formed of a p-channel TFT according to the present invention. Regarding the production process, Embodiment Modes 1 to 3 and Embodiments 1 to 4 should be referred to.

In this embodiment, a transparent conductive film is used as a pixel electrode (anode) 50. More specifically, a conductive film made of a compound of indium oxide and zinc oxide is used. Needless to say, a conductive film made of a compound of indium oxide and tin oxide may be used.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 3701 is formed.

In this embodiment, light generated by the light-emitting layer 52 is irradiated toward the substrate on which a TFT is formed as represented by an arrow.

This embodiment can be realized by being appropriately combined with Embodiment Modes 1 to 3 and Embodiments 1 to 42. Furthermore, it is effective to use the EL display panel of this embodiment as a display portion of electronic apparatus of Embodiment 5.

Embodiment 10

In this embodiment, referring to FIGS. 24A to 24C, the case will be described where a pixel having a different structure from that of the circuit diagram shown in FIG. 22B is used. Note that reference numeral 3801 denotes a source line of a TFT 3802 for switching, 3803 denotes a gate line of the TFT 3802 for switching, 3804 denotes a TFT for controlling a current, 3805 denotes a capacitor, 3806 and 3808 denote current supply lines, and 3807 denotes an EL element.

Figure 24A:
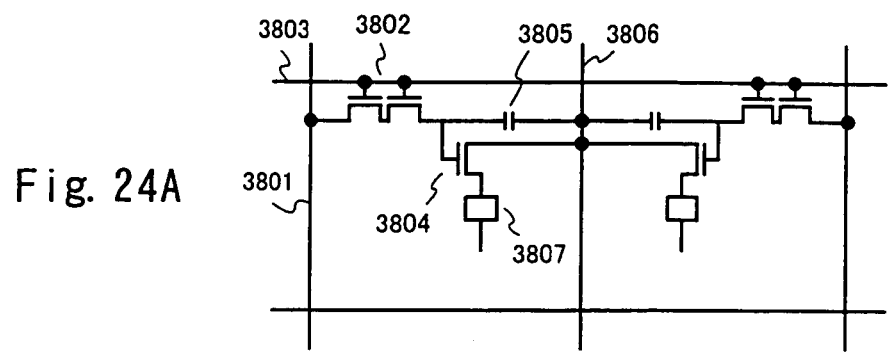
FIGS. 24A to 24C are diagrams showing the structure of yet still another EL display device.

FIG. 24A shows the case where two pixels share the current supply line 3806. More specifically, two pixels are formed so as to be axisymmetric with respect to the current supply line 3806. In this case, the number of power supply lines can be reduced, so that the pixel portion is allowed to have a higher definition.

Figure 24B:
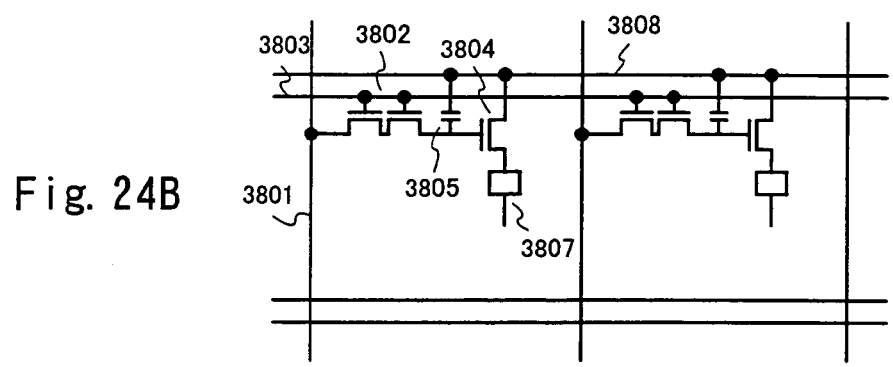

Furthermore, FIG. 24B shows the case where the current supply line 3808 and the gate line 3803 are provided in parallel. Note that in FIG. 24B the current supply line 3808 does not overlap the gate line 3803, if both lines are formed on different layers, they can be provided so as to overlap each other via an insulating film. In this case, the current supply line 3808 and the gate line 3803 can share an occupied area, so that a pixel portion is allowed to have higher definition.

Figure 24C:
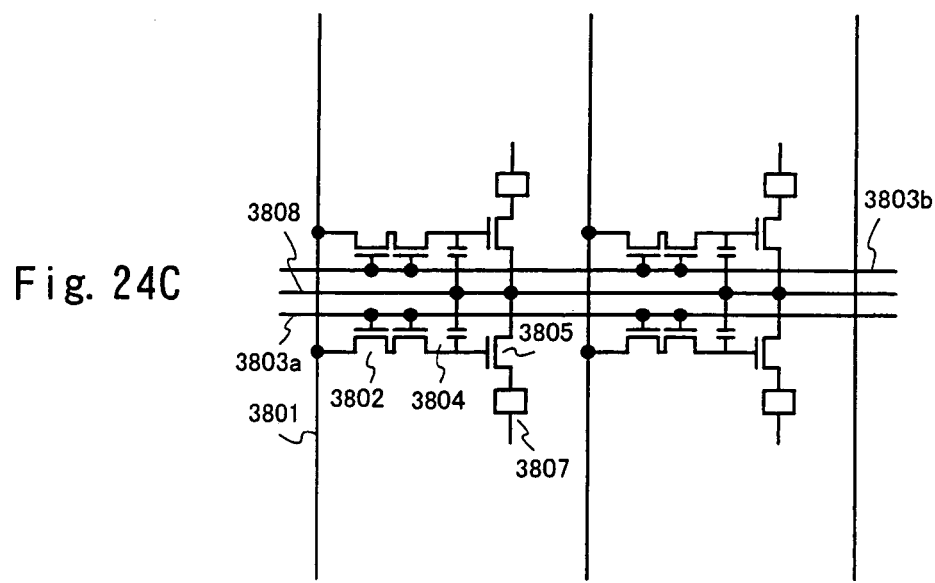

Furthermore, FIG. 24C shows the case where the current supply line 3808 and gate lines 3803 are provided in parallel in the same way as in FIG. 24B, and two pixels are formed so as to be axisymmetric with respect to the current supply line 3808. It is also effective to provide the current supply line 3808 so as to overlap one of the gate lines 3803. In this case, the number of the power supply lines can be reduced, so that a pixel portion is allowed to have higher definition.

This embodiment can be realized by being appropriately combined with Embodiment Modes 1 to 3 and Embodiments 1 to 4. Furthermore, it is effective to use the EL display panel having a pixel structure of this embodiment as a display portion of an electronic apparatus of Embodiment 5.

Embodiment 11

In FIGS. 22A and 22B of Embodiment 8, the capacitor 3504 is provided so as to hold a voltage applied to a gate of the TFT 3503 for controlling a current. However, the capacitor 3504 can be omitted. In the case of Embodiment 7, since the n-channel TFT as shown in Embodiment Modes 1 to 3, and Embodiments 1 to 4 of the present invention is used as the TFT 3503 for controlling a current, the TFT has an LDD region provided so as to overlap a gate electrode via a gate insulating film. In this region, a parasitic capacitor called a gate capacitor is generally formed. This embodiment is characterized in that the parasitic capacitor is actively used in place of the capacitor 3504.

The capacitance of the parasitic capacitor is varied depending upon the above-mentioned area in which the gate electrode overlaps the LDD region. Therefore, the capacitance is determined by the length of the LDD region included in the region.

Similarly, in the structure shown in FIGS. 24A, 24B, and 24C of Embodiment 10, the capacitor 3805 can also be omitted.

This embodiment can be realized by being appropriately combined with the structures of Embodiment Modes 1 to 3 and Embodiments 1 to 4. Furthermore, it is effective to use an EL display panel having a pixel structure of this embodiment as a display portion of an electronic apparatus of Embodiment 5.

By employing the techniques of the present invention, it is possible to form a crystalline semiconductor film while controlling the location and the size of the crystal grain in the film. The position of the crystal grain of the crystalline semiconductor film is thus can be formed in accordance with the channel forming region of the TFT, thereby exponentially improving the static characteristic and dynamic characteristic of the TFT.

What is claimed is:

1. A method of manufacturing a semiconductor device comprising the steps of:
   forming an island-like insulating film on a surface of a substrate;
   forming a base insulating film so as to cover top and sides of said island-like insulating film and said substrate;
   forming a semiconductor film on said base insulating film;
   patterning said semiconductor film to form a semiconductor island;
   crystallizing said semiconductor island by irradiating a laser light;
   forming a gate insulating film on said island-like semiconductor film; and
   forming a gate electrode on said gate insulating film so that the gate electrode overlaps with the island-like insulating film.

2. A method of manufacturing a semiconductor device according to claim 1, wherein said substrate is light transmissive.

3. A method of manufacturing a semiconductor device according to claim 1, wherein the crystallization is achieved by adopting a method of laser annealing in which the front side of said semiconductor film, or both the front side and back side thereof are directly irradiated with said laser light.

4. A method of manufacturing a semiconductor device according to claim 1, wherein the same material is used for said island-like insulating film and for said base insulating film.

5. A method of manufacturing a semiconductor device according to claim 1, wherein materials used for said island-like insulating film and for said base insulating film have a difference in heat conductance, with the difference being 10% or less.

6. A method of manufacturing a semiconductor device according to claim 1, wherein crystal nuclear is used in crystallizing said semiconductor film, said crystal nuclear being generated by temperature gradient due to a level difference in said island-like insulating film.

7. A method of manufacturing a semiconductor device, comprising the steps of:
- forming an insulating film on a surface of a substrate;
- forming an island-like insulating projection on said insulating film;
- forming a semiconductor film to cover said insulating film and said island-like insulating projection;
- patterning said semiconductor film to form a semiconductor island;
- crystallizing said semiconductor island by irradiating a laser light;
- forming a gate insulating film on said semiconductor island; and
- forming a gate electrode on said gate insulating film so that the gate electrode overlaps with the island-like insulating projection.

8. A method of manufacturing a semiconductor device according to claim 7, wherein said substrate is light transmissive.

9. A method of manufacturing a semiconductor device according to claim 7, wherein the crystallization is achieved by adopting a method of laser annealing in which the front side of said semiconductor film, or both the front side and back side thereof are directly irradiated with said laser light.

10. A method of manufacturing a semiconductor device according to claim 7, wherein the same material is used for said island-like insulating projection and for said insulating film.

11. A method of manufacturing a semiconductor device according to claim 7, wherein materials used for said island-like insulating projection and for said insulating film have a difference in heat conductance, with the difference being 10% or less.

12. A method of manufacturing a semiconductor device according to claim 7, wherein crystal nuclear is used in crystallizing said semiconductor film, said crystal nuclear being generated by temperature gradient due to a level difference in said island-like insulating projection.

13. A method of manufacturing a semiconductor device comprising the steps of:
- forming an island-like insulating film over a surface of a substrate;
- forming a base insulating film so as to cover top and sides of said island-like insulating film and said substrate;
- forming a semiconductor film on said base insulating film;
- patterning said semiconductor film to form a semiconductor island; and
- crystallizing said semiconductor island by irradiating a laser light,
- wherein a channel region is formed in the semiconductor island so that the channel region overlaps with the semiconductor island.

14. A method of manufacturing a semiconductor device according to claim 13, wherein said substrate is light transmissive.

15. A method of manufacturing a semiconductor device according to claim 13, wherein the crystallization is achieved by adopting a method of laser annealing in which the front side of said semiconductor film, or both the front side and back side thereof are directly irradiated with said laser light.

16. A method of manufacturing a semiconductor device according to claim 13, wherein the same material is used for said island-like insulating film and for said base insulating film.

17. A method of manufacturing a semiconductor device according to claim 13, wherein materials used for said island-like insulating film and for said base insulating film have a difference in heat conductance, with the difference being 10% or less.

18. A method of manufacturing a semiconductor device according to claim 13, wherein crystal nuclear is used in crystallizing said semiconductor film, said crystal nuclear being generated by temperature gradient due to a level difference in said island-like insulating film.

19. A method of manufacturing a semiconductor device, comprising the steps of:
- forming an insulating film over a surface of a substrate;
- forming an island-like insulating projection on said insulating film;
- forming a semiconductor film to cover said insulating film and said island-like insulating projection;
- patterning said semiconductor film to form a semiconductor island; and
- crystallizing said semiconductor island by irradiating a laser light,
- wherein a channel region is formed in the semiconductor island so that the channel region overlaps with the semiconductor island.

20. A method of manufacturing a semiconductor device according to claim 19, wherein said substrate is light transmissive.

21. A method of manufacturing a semiconductor device according to claim 19, wherein the crystallization is achieved by adopting a method of laser annealing in which the front side of said semiconductor film, or both the front side and back side thereof are directly irradiated with said laser light.

22. A method of manufacturing a semiconductor device according to claim 19, wherein the same material is used for said island-like insulating projection and for said insulating film.

23. A method of manufacturing a semiconductor device according to claim 19, wherein materials used for said island-like insulating projection and for said insulating film have a difference in heat conductance, with the difference being 10% or less.

24. A method of manufacturing a semiconductor device according to claim 19, wherein crystal nuclear is used in crystallizing said semiconductor film, said crystal nuclear being generated by temperature gradient due to a level difference in said island-like insulating projection.

* * * * *